United States Patent
Takagiwa

(10) Patent No.: US 11,461,261 B2
(45) Date of Patent: Oct. 4, 2022

(54) SEMICONDUCTOR MEMORY DEVICE

(71) Applicant: Kioxia Corporation, Tokyo (JP)

(72) Inventor: Teruo Takagiwa, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/168,285

(22) Filed: Feb. 5, 2021

(65) Prior Publication Data

US 2021/0286746 A1  Sep. 16, 2021

(30) Foreign Application Priority Data

Mar. 12, 2020 (JP) .............................. JP2020-042795

(51) Int. Cl.
| | | |
|---|---|---|
| G06F 3/06 | (2006.01) | |
| G06F 11/10 | (2006.01) | |
| G06F 13/40 | (2006.01) | |
| G06F 13/16 | (2006.01) | |
| G11C 16/04 | (2006.01) | |

(52) U.S. Cl.
CPC ...... *G06F 13/4022* (2013.01); *G06F 13/1668* (2013.01); *G11C 16/0483* (2013.01)

(58) Field of Classification Search
None
See application file for complete search history.

(56) References Cited

U.S. PATENT DOCUMENTS

| 6,058,479 | A | * | 5/2000 | Sørhaug | ................. H04L 9/065 380/200 |
|---|---|---|---|---|---|
| 8,885,425 | B2 | | 11/2014 | Takagiwa | |
| 9,583,220 | B2 | | 2/2017 | Tsai et al. | |
| 10,891,987 | B2 | | 1/2021 | Takagiwa | |
| 2012/0075943 | A1 | | 3/2012 | Chen et al. | |
| 2014/0063964 | A1 | * | 3/2014 | Futatsuyama | .......... G11C 16/04 365/185.05 |
| 2014/0078833 | A1 | * | 3/2014 | Bunce | ...................... G11C 7/18 365/189.05 |
| 2017/0031756 | A1 | * | 2/2017 | Chung | .................. G06F 3/0619 |
| 2018/0047360 | A1 | * | 2/2018 | Cai | ...................... G09G 3/3677 |
| 2019/0378552 | A1 | * | 12/2019 | Abedifard | ............. G11C 11/161 |

* cited by examiner

*Primary Examiner* — Hyun Nam
(74) *Attorney, Agent, or Firm* — Holtz, Holtz & Volek PC

(57) ABSTRACT

According to one embodiment, a semiconductor memory device includes a first string including a first memory cell transistor and a second memory cell transistor which are coupled in series, a first switch element, a first latch circuit coupled in series between a first end of the first string and a first end of the first switch element, and a second switch element and a third switch element coupled in parallel between a second end of the first switch element and a data bus.

18 Claims, 15 Drawing Sheets

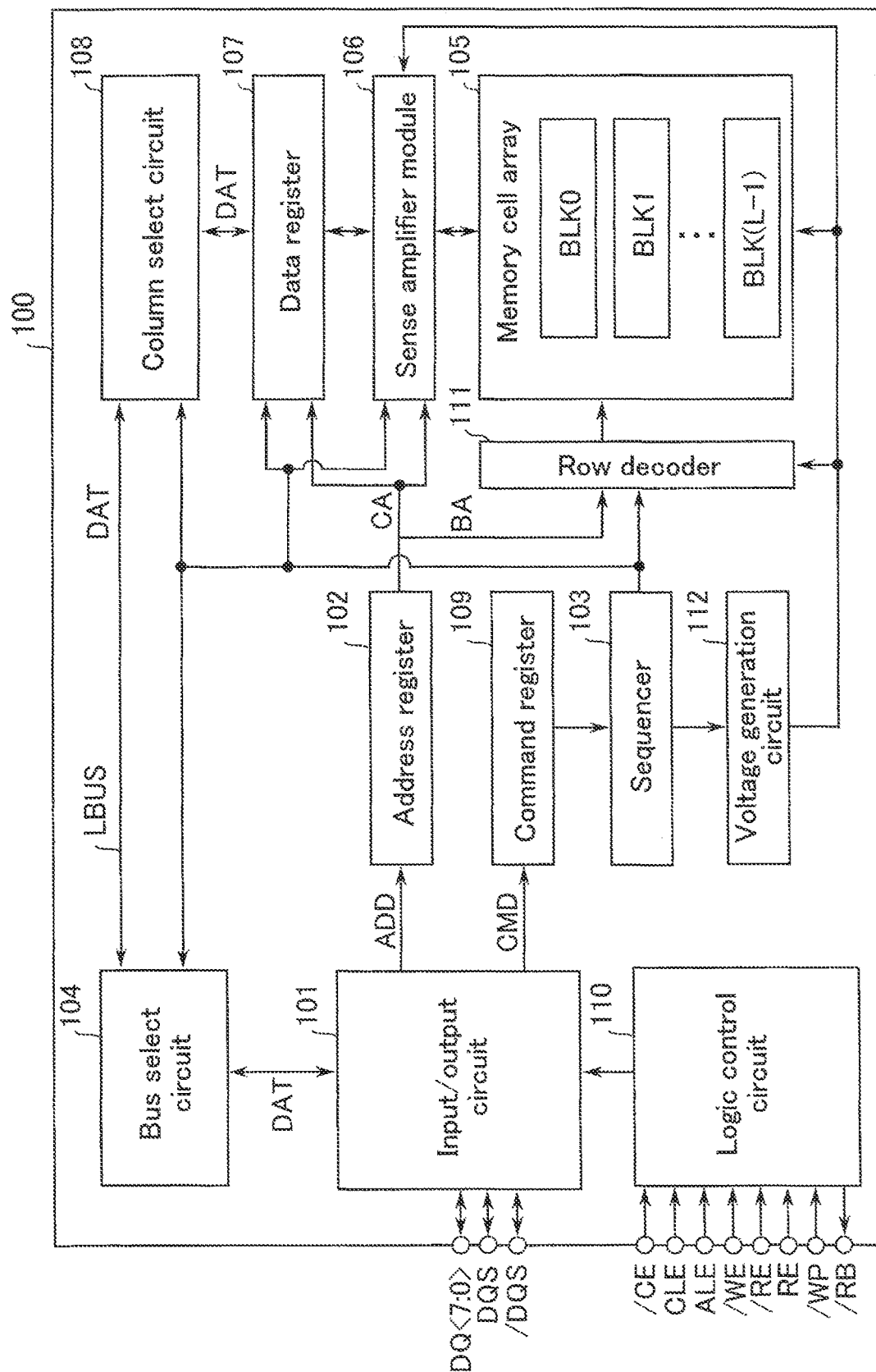
F I G. 2

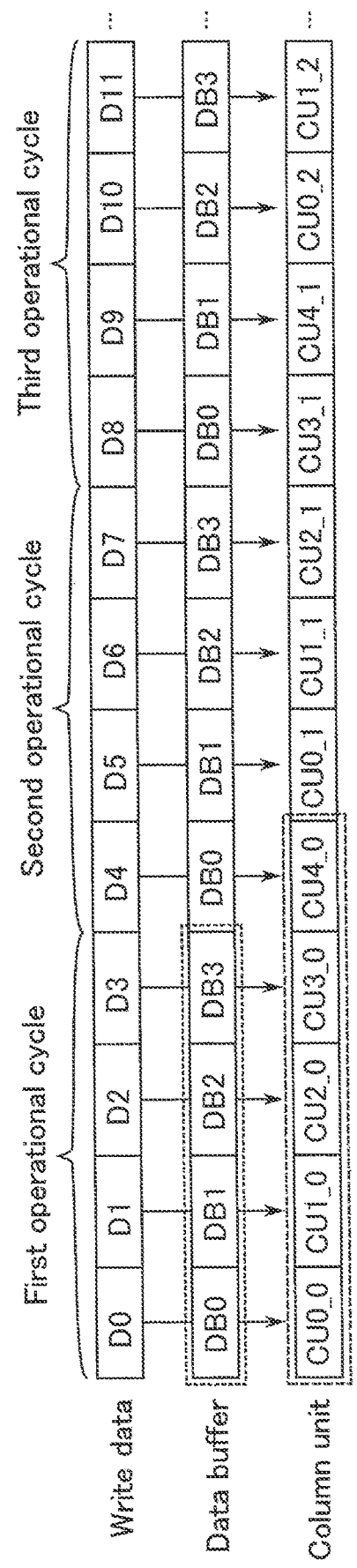
F I G. 7

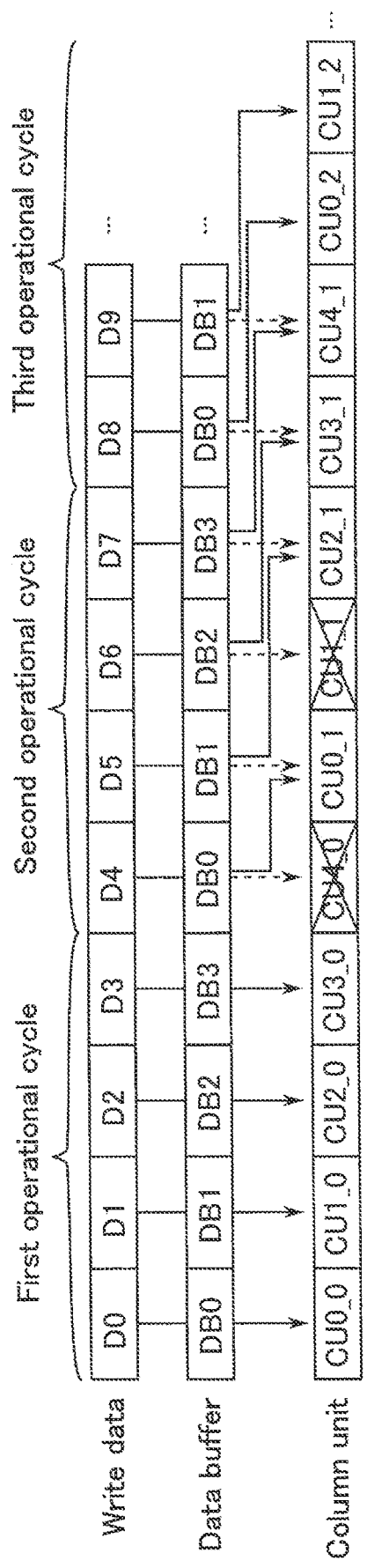
F I G. 9

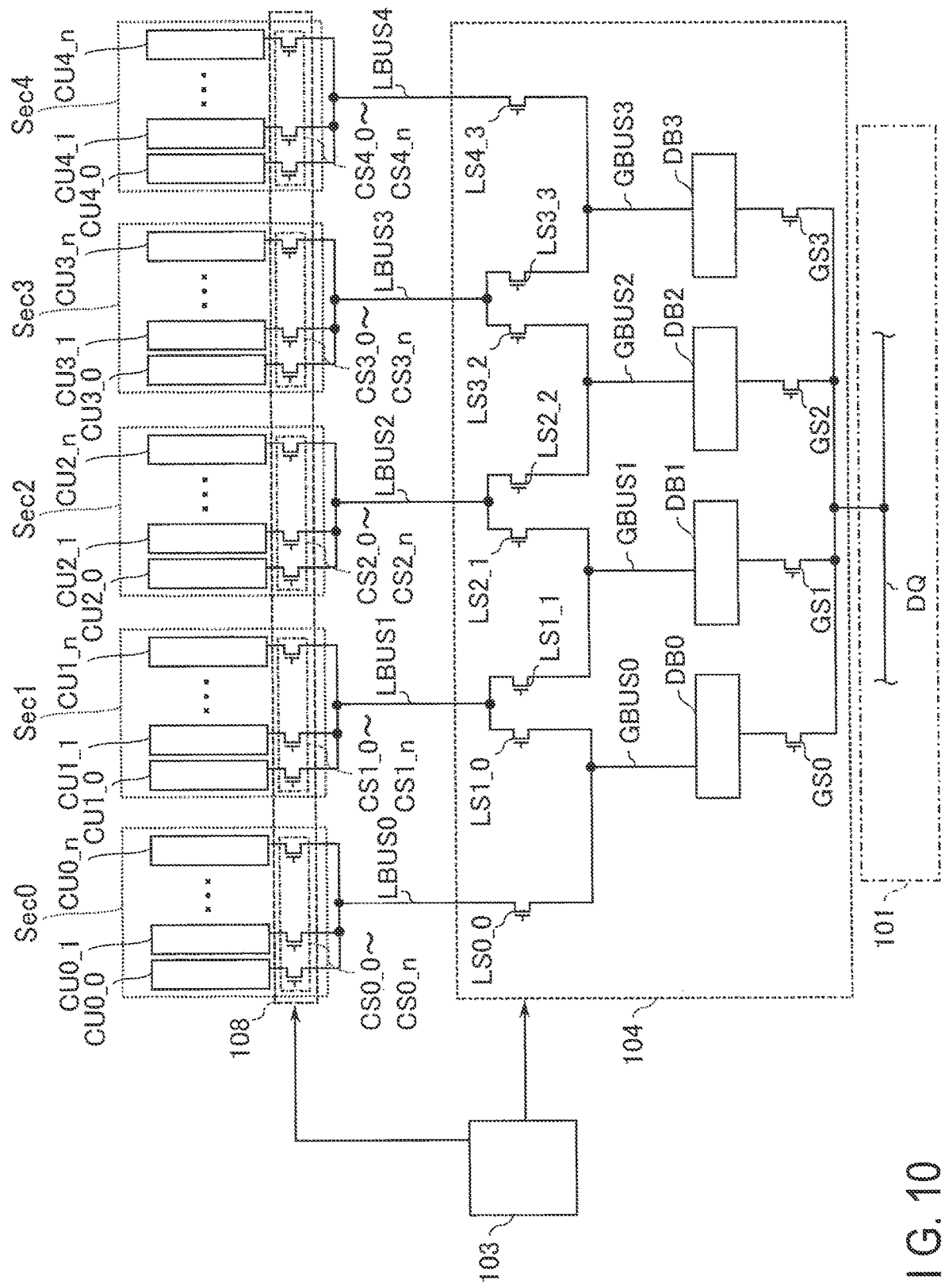
F I G. 10

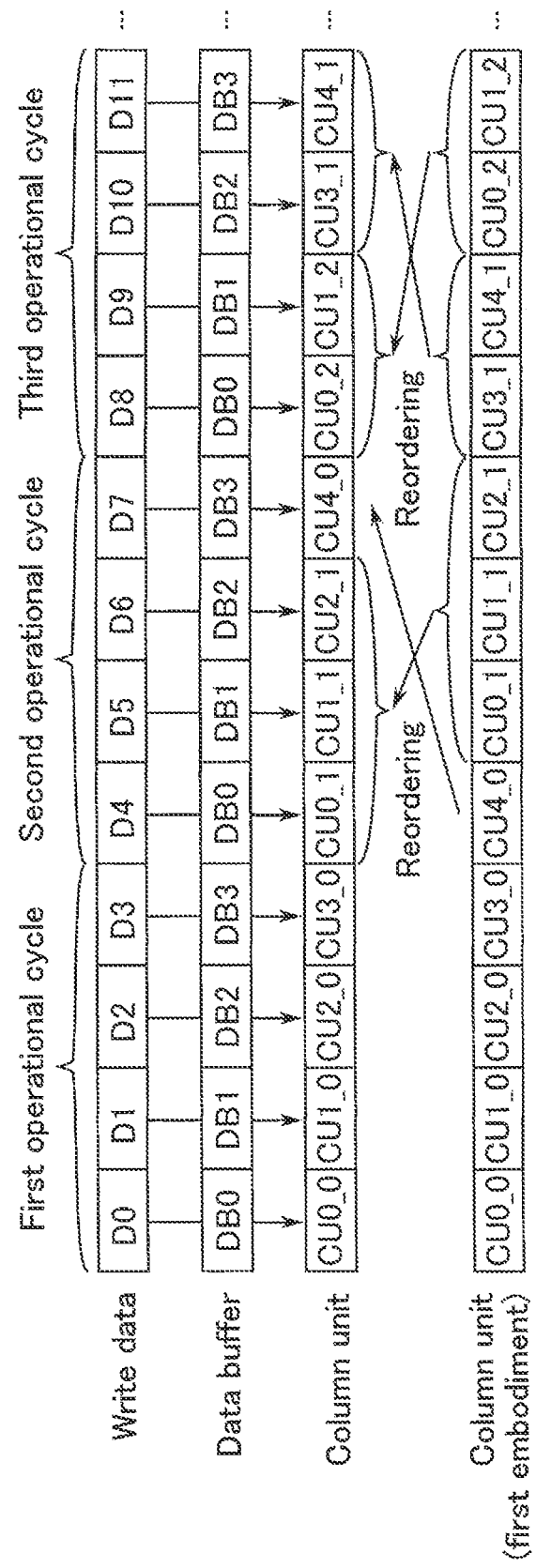
F I G. 11

SEMICONDUCTOR MEMORY DEVICE

CROSS-REFERENCE TO RELATED APPLICATIONS

This application is based upon and claims the benefit of priority from Japanese Patent Application No. 2020-042795, filed Mar. 12, 2020, the entire contents of which are incorporated herein by reference.

FIELD

Embodiments described herein relate generally to a semiconductor memory device.

BACKGROUND

A NAND flash memory as a semiconductor memory device is known.

BRIEF DESCRIPTION OF THE DRAWINGS

FIG. 2 is a block diagram showing an exemplary configuration of the semiconductor memory device according to the first embodiment.

FIG. 7 is a schematic diagram for explaining an example of write data and column units for storing the write data in the semiconductor memory device according to the first embodiment.

FIG. 9 is a schematic diagram for explaining an example of write data and column units for storing the write data in the semiconductor memory device according to the first embodiment, when there is one or more defective column units.

FIG. 10 is a block diagram showing an exemplary configuration of column units, an input/output circuit, a bus select circuit, and a column select circuit in a semiconductor memory device according to a second embodiment.

FIG. 11 is a schematic diagram for explaining an example of write data and column units for storing the write data in the semiconductor memory device according to the second embodiment.

DETAILED DESCRIPTION

In general, according to one embodiment, a semiconductor memory device includes a first string including a first memory cell transistor and a second memory cell transistor which are coupled in series, a first switch element, a first latch circuit serially coupled between a first end of the first string and a first end of the first switch element, and a second switch element and a third switch element each configured to couple a second end of the first switch element and a data bus, the second switch element and the third switch element being parallel to each other.

Now, the embodiments will be described with reference to the drawings. The description will use the same reference symbols for the structural features or components having the same or substantially the same functions and configurations.

1. First Embodiment

A semiconductor memory device according to the first embodiment will be described. By way of example, the description will assume the semiconductor memory device to be a NAND flash memory.

<1.1 Configuration>

A configuration of the semiconductor memory device according to the first embodiment will be described.

<1.1.1 Overall Configuration of Memory System>

Figure 1:
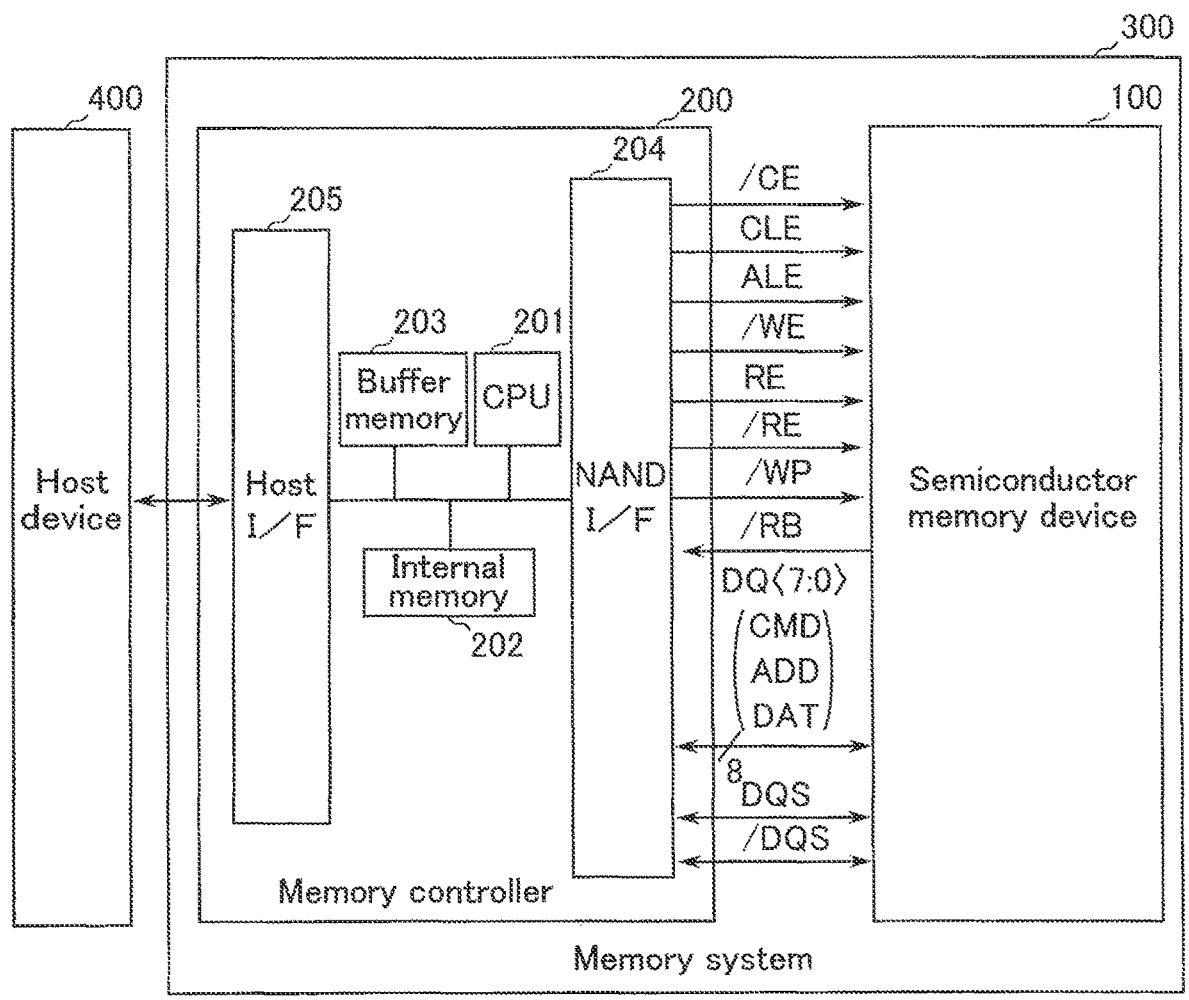
FIG. 1 is a block diagram showing an exemplary configuration of a memory system including a semiconductor memory device according to a first embodiment.

The description starts with a configuration of a memory system by referring to FIG. 1. FIG. 1 is a block diagram showing an exemplary configuration of a memory system including a semiconductor memory device according to the first embodiment.

The memory system, denoted by numeral 300, is adapted for communication with an external host device 400, for example. The memory system 300 stores data from the host device 400 and passes data to the host device 400. The memory system 300 may be, for example, a solid state drive (SSD), an SD™ card, etc.

As shown in FIG. 1, the memory system 300 includes a memory controller 200 and a semiconductor memory device 100.

The memory controller 200 is adapted to receive commands from the host device 400 and control the semiconductor memory device 100 based on the received commands. More specifically, the memory controller 200 writes data designated by the host device 400 for a write operation into the semiconductor memory device 100, and reads data designated by the host device 400 for a read operation from the semiconductor memory device 100 and sends it to the host device 400.

The semiconductor memory device 100 includes multiple memory cell transistors so that it stores data in a nonvolatile manner. The semiconductor memory device 100 is coupled with the memory controller 200 via a NAND bus.

The NAND bus allows for transmission and reception of signals that comply with the NAND interface, i.e., signals /CE, CLE, ALE, /WE, /RE, RE, /WP, /RB, DQS, /DQS, and DQ<7:0>, with their respective, individual signal lines. The signal /CE is for placing the semiconductor memory device 100 in an enabled state. The signal CLE is an indication for the semiconductor memory device 100 that the signal DQ<7:0> sent to the semiconductor memory device 100 during the signal CLE being at the "H (high)" level is a command. The signal ALE is an indication for the semiconductor memory device 100 that the signal DQ<7:0> sent to the semiconductor memory device 100 during the signal ALE being at the "H" level is an address. The signal /WE is an instruction for the semiconductor memory device 100 to take in the signal DQ<7:0> sent to the semiconductor memory device 100 during the signal /WE being at the "L (low)" level. The signal /RE is an instruction for the semiconductor memory device 100 to output the signal DQ<7:0>. The signal RE is a complementary signal to the signal /RE. The signal /WP is an instruction for the semiconductor memory device 100 not to perform data write or data erase. The signal /RB is an indication that the semiconductor memory device 100 is in a ready state (the state where an external command is accepted) or a busy state (the state where an external command is not accepted). The signal DQS is a data strobe signal. The signal /DQS is a complementary signal to the signal DQS. The signal DQ<7:0> is, for example, a signal of 8 bits.

The signal DQ<7:0> is communicated between the semiconductor memory device 100 and the memory controller 200, and includes a command CMD, an address ADD, and data DAT. The data DAT includes write data and read data. The signals DQS and /DQS, together with the signal DQ<7:0> as the data DAT, are communicated between the semiconductor memory device 100 and the memory controller 200.

Examples of the host device 400 that makes use of the memory system 300 above include a digital camera, a personal computer, etc.

<1.1.2 Configuration of Memory Controller>

As shown in FIG. 1, the memory controller 200 includes a central processing unit (CPU) 201, an internal memory 202, a buffer memory 203, a NAND interface circuit (NAND I/F) 204, and a host interface circuit (host I/F) 205. The memory controller 200 is configured as, for example, a system-on-a-chip (SoC).

The CPU 201 takes total control over the operations of the memory controller 200. For example, the CPU 201 is adapted to issue a read command that complies with the NAND interface to the semiconductor memory device 100 in response to a data read command received from the host device 400. Write and erase actions involve operations similar to this. The CPU 201 also has a function to perform various arithmetic operations on the read data from the semiconductor memory device 100.

The internal memory 202 may be, for example, a semiconductor memory such as a dynamic random access memory (DRAM), provided for use by the CPU 201 as a workspace. The internal memory 202 stores firmware, various management tables, etc., for managing the semiconductor memory device 100.

The buffer memory 203 is adapted to temporarily store data such as the read data received by the memory controller 200 from the semiconductor memory device 100, the write data received from the host device 400, etc.

The NAND interface circuit 204 is coupled to the semiconductor memory device 100 via the NAND bus, and controls communications with the semiconductor memory device 100. The NAND interface circuit 204 is adapted to send the command CMD, the address ADD, and the write data to the semiconductor memory device 100, according to instructions from the CPU 201. The NAND interface circuit 204 is adapted also to receive the read data from the semiconductor memory device 100.

The host interface circuit 205 is coupled to the host device 400 via a host bus, and controls communications between the memory controller 200 and the host device 400. The host interface circuit 205 is adapted to transfer, for example, a command and data received from the host device 400 to the CPU 201 and the buffer memory 203, respectively.

<1.1.3 Configuration of Semiconductor Memory Device>

Next, an explanation for an exemplary configuration of the semiconductor memory device according to the first embodiment will be given with reference to FIG. 2. FIG. 2 is a block diagram showing an exemplary configuration of the semiconductor memory device 100 according to the first embodiment.

The semiconductor memory device 100 includes an input/output circuit 101, an address register 102, a sequencer (data transfer control circuit) 103, a bus select circuit 104, a memory cell array 105, a sense amplifier module 106, a data register 107, a column select circuit 108, a command register 109, a logic control circuit 110, a row decoder 111, and a voltage generation circuit 112.

The input/output circuit 101 is adapted to communicate the signal DQ<7:0> and the data strobe signals DQS and /DQS with the memory controller 200. The input/output circuit 101 transfers the address ADD and the command CMD included in the signal DQ<7:0> to the address register 102 and the command register 109, respectively. The input/output circuit 101 is also adapted to communicate the data DAT with the data register 107 via the bus select circuit 104 and the column select circuit 108.

The address register 102 is adapted to store the address ADD transferred from the input/output circuit 101. The address register 102 transfers a column address CA included in the address ADD to the sense amplifier module 106 and the data register 107, and a block address BA included in the address ADD to the row decoder 111.

The sequencer 103 is adapted to receive a command and control the entire semiconductor memory device 100 according to a sequence based on the received command. The sequencer 103 is also adapted to control the bus select circuit 104 and the column select circuit 108, so that data transfer between the input/output circuit 101 and the data register 107 is enabled for the write and read operations. That is, the sequencer 103 in the context of this embodiment functions as a data transfer control circuit for controlling data transfer between the input/output circuit 101 and the data register 107 via the bus select circuit 104 and the column select circuit 108. Note that the semiconductor memory device 100 may be configured so that the column address CA is also routed to the sequencer 103 as the data transfer control circuit.

The bus select circuit 104 is adapted to transfer, under the control of the sequencer 103, the data DAT received from the input/output circuit 101 to the data register 107, and the data DAT received from the data register 107 to the input/output circuit 101. More specifically, the bus select circuit 104 at the time of the write operation transfers write data received from the input/output circuit 101 to a local bus LBUS coupled to the data register 107, and at the time of the read operation transfers read data received from the data register 107 via the local bus LBUS to the input/output circuit 101.

The memory cell array 105 includes multiple blocks BLK (BLK0, BLK1, . . . and BLK(L−1), where L is an integer equal to or greater than 2). The blocks BLK each include multiple nonvolatile memory cell transistors associated with corresponding bit and word lines, and each constitute, for example, a unit for data erasure. The semiconductor memory device 100 involves implementation of various operations such as a write operation of storing write data in the memory cell array 105, a read operation of acquiring read data based on data from the memory cell array 105, and so on.

The sense amplifier module 106 is adapted to produce the read data by sensing data read from the memory cell array 105 and transfer the produced read data to the data register 107. The sense amplifier module 106 is also adapted to receive the write data from the data register 107 and transfer the received write data to the memory cell array 105.

The data register 107 includes multiple latch circuits. The data register 107 is adapted to temporarily store the write data received from the bus select circuit 104 via the local bus LBUS and transfer the write data to the sense amplifier module 106. The data register 107 is adapted to temporarily store the read data received from the sense amplifier module 106 and transfer the read data to the bus select circuit 104 via the local bus LBUS.

The column select circuit 108 is adapted to transfer, under the control of the sequencer 103, the data in the data register 107 to the local bus LBUS in sequence.

The command register 109 is adapted to store the command CMD transferred from the input/output circuit 101.

The logic control circuit 110 is adapted to receive various signals from the memory controller 200, such as the chip enable signal /CE, the command latch enable signal CLE, the address latch enable signal ALE, the write enable signal /WE, the read enable signals /RE and RE, and the write protect signal /WP. The logic control circuit 110 is adapted to control the input/output circuit 101 according to the received signals. Also, the logic control circuit 110 is adapted to generate the ready/busy signal /RB and send the generated ready/busy signal /RB to the memory controller 200.

The row decoder 111 is adapted to select one of the blocks BLK0 to BLK(L−1) based on the block address BA received from the address register 102. The row decoder 111 also makes a selection in the direction of rows corresponding to multiple word lines in the selected block BLK so that a voltage supplied from the voltage generation circuit 112 is applied to a selected word line.

The voltage generation circuit 112 is adapted to generate voltages for use in the write and read operations, etc., and supply the generated voltages to the memory cell array 105, the sense amplifier module 106, the row decoder 111, etc., under the control of the sequencer 103.

<1.1.4 Configuration of Memory Cell Array>

Figure 3:
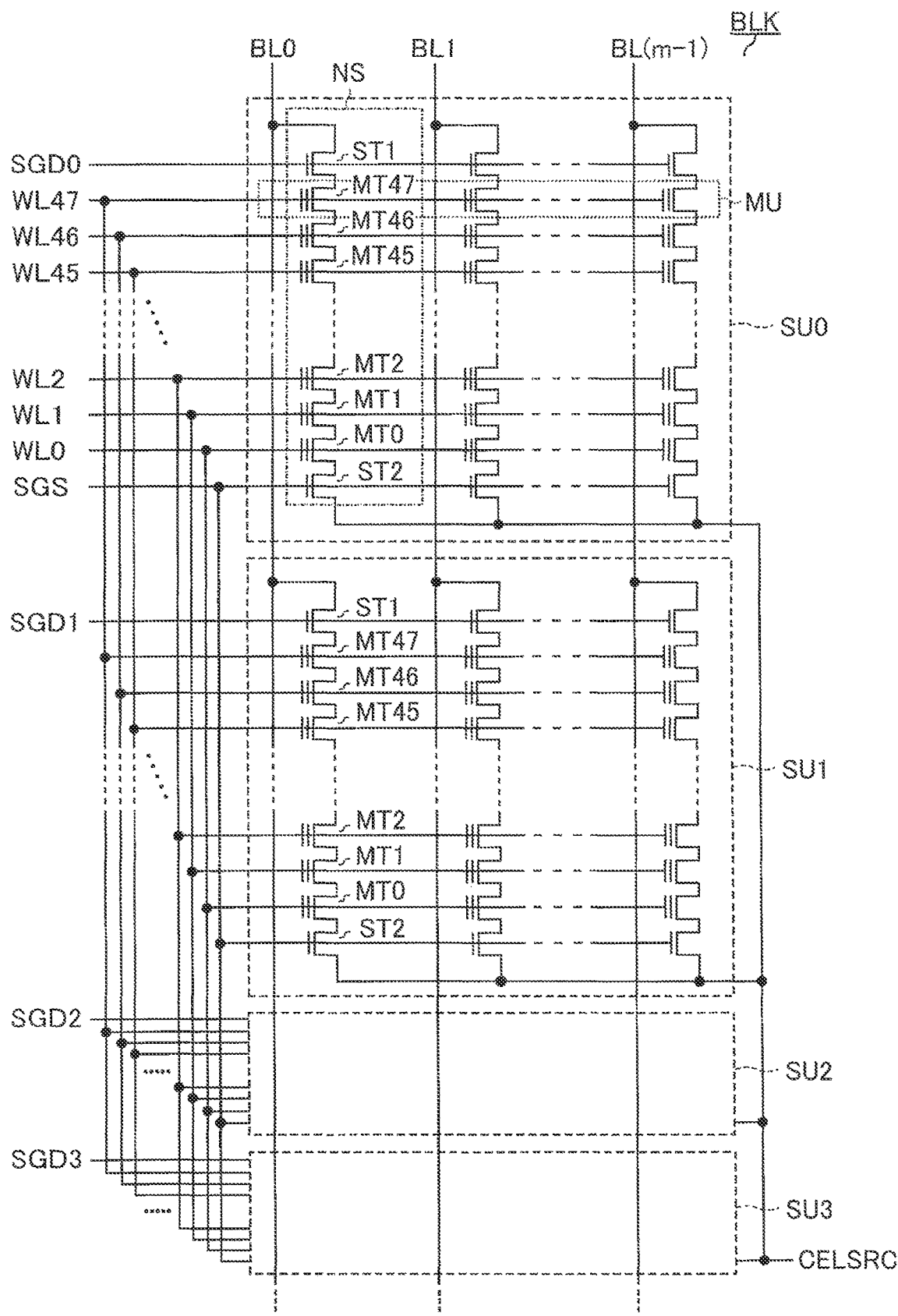
FIG. 3 is a circuit diagram for explaining a configuration of a memory cell array in the semiconductor memory device according to the first embodiment.

Next, with reference to FIG. 3, the configuration of the memory cell array in the semiconductor memory device according to the first embodiment will be described. FIG. 3 is a circuit diagram for explaining an exemplary configuration of the memory cell array 105 in the semiconductor memory device according to the first embodiment.

As shown in FIG. 3, the block BLK includes, for example, four string units SU (SU0 to SU3). The string units SU each include multiple NAND strings NS.

The NAND strings NS each include, for example, 48 memory cell transistors MT (MT0 to MT47) and select transistors ST1 and ST2. Note that the number of memory cell transistors MT in each NAND string NS is not limited to 48 but may be discretionarily determined to be, for example, 8, 16, 32, 64, 96, 128, and so on. The memory cell transistors MT each include a stacked gate that includes a control gate and a charge accumulating layer. The memory cell transistors MT are coupled in series between the select transistors ST1 and ST2.

In one block BLK, the multiple select transistors ST1 in each of the string units SU0 to SU3 have their gates coupled to the respective, corresponding one of common select gate lines SGD0 to SGD3. Also in one block BLK, the select transistors ST2 in the string units SU have their gates all coupled to a common select gate line SGS. Note that the select gate line SGS may be divided and provided for the select transistors ST2 in the respective string units SU0 to SU3 as in the configuration of the select gate lines SGDs (in other words, the multiple select transistors ST2 in each of the string units SU0 to SU3 may have their gates coupled to the respective, corresponding one of the common select gate lines SGS0 to SGS3 (not illustrated)). The memory cell transistors MT0 to MT47 within the same block BLK have their control gates coupled to word lines WL0 to WL47, respectively. That is, each word line WL of its respective address is a common line coupled to all the string units SU within the same block BLK, and the select gate line SGS is a common line coupled to all the string units SU within the same block BLK. On the other hand, each select gate line SGD is coupled only to the corresponding one of the string units SU within the same block BLK.

In the memory cell array 105 where the NAND strings NS are arranged in matrix pattern, the multiple select transistors ST1 in the NAND strings NS, arranged along the same column, have their other ends coupled to one of m bit lines BL (BL0 to BL(m−1), where m is a natural number). The bit line BL is a common line coupled to the NAND strings NS of the same column, over the multiple blocks BLK.

Also, the select transistors ST2 have their other ends (ends different from the gates) coupled to a source line CELSRC. The source line CELSRC is a common line coupled to the multiple NAND strings NS over the multiple blocks BLK.

As mentioned above, data erasure in one exemplary implementation is performed at once for the memory cell transistors MT within the same block BLK. In contrast, data read and data write are each performed at once for the multiple memory cell transistors MT which are together coupled to a given word line WL in a given string unit SU in a given block BLK. A group of such memory cell transistors MT sharing the common word line WL within one string unit SU is called, for example, a "memory cell unit MU". Thus, the memory cell unit MU is a group of memory cell transistors MT that can be subjected to a batch write or read operation.

A unit of data string, constituted by 1-bit data stored by each of the multiple memory cell transistors MT within the memory cell unit MU, is defined as a "page". For example, when each memory cell transistor MT is capable of storing 2-bit data, the memory cell unit MU is capable of storing 2-page data. Of course, 2-bit data is not a limitation, and each memory cell transistor MT may be adapted to store data of 3 bits or larger.

<1.1.5 Configuration of Sense Amplifier and Data Register>

Figure 4:
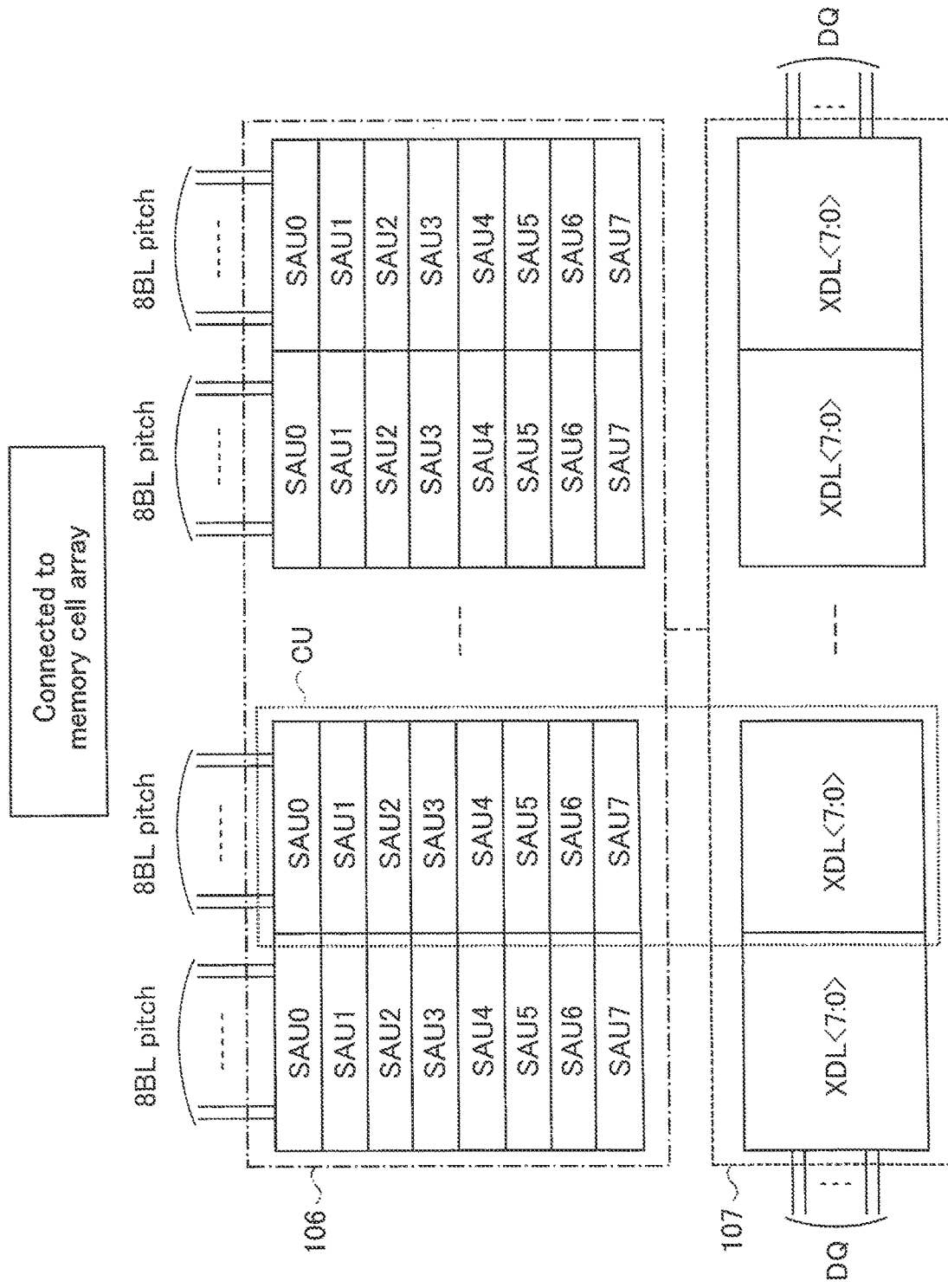
FIG. 4 is a block diagram showing an exemplary configuration of a sense amplifier module and a data register in the semiconductor memory device according to the first embodiment.

FIG. 4 is a block diagram showing an exemplary configuration of the sense amplifier module 106 and the data register 107 in the semiconductor memory device 100 according to the first embodiment.

The sense amplifier module 106 includes multiple sense amplifier units SAU.

In the sense amplifier module 106, for example, the sense amplifier units SAU are provided for the respective bit lines BL. In one exemplary implementation, eight sense amplifier units SAU (SAU0 to SAU7) are provided for each set of eight bit lines BL. The sense amplifier units SAU are each adapted to read data via the corresponding bit line BL, and to transfer write data to the corresponding bit line BL.

The data register 107 includes multiple latch circuits XDL.

In the data register 107, the latch circuits XDL are provided for the respective sense amplifier units SAU. In one exemplary implementation, eight latch circuits XDL0 to XDL7 (collectively denoted as "XDL<7:0>" in FIG. 4) are provided for the respective eight sense amplifier units SAU, each in one-to-one correspondence. The latch circuits XDL are each coupled to the corresponding sense amplifier unit SAU. Each latch circuit XDL is associated with one bit line BL via the corresponding sense amplifier unit SAU, and adapted to temporarily store the data that pertains to the corresponding bit line BL.

The eight bit lines BL, and the eight sense amplifier units SAU and the eight latch circuits XDL corresponding to these bit lines BL form one column unit CU as a unit of control subject. Here, one column unit CU corresponds to 8-bit data. However, the number of bit lines BL, the number of sense amplifier units SAU, or the number of latch circuits XDL, which should be included in one column unit CU, is not limited to 8.

The latch circuits XDL of the latch circuit set XDL<7:0> are coupled to the respective, corresponding ones of the multiple data lines DQ intended for the signal DQ<7:0>. The data lines DQ are each coupled to the corresponding latch circuit XDL among the latch circuit set XDL<7:0>.

The latch circuits XDL are adapted to enable data communications between the sense amplifier units SAU and the bus select circuit 104, via the data lines DQ and also interconnects providing connections between the latch circuits XDL and the respective, corresponding sense amplifier units SAU. More specifically, and for example, when data is received from the memory controller 200, etc., the data is sent through the data lines DQ and stored by the latch circuits XDL in the data register 107, and then transferred to the sense amplifier units SAU in the sense amplifier module 106 via the interconnects between the latch circuits XDL and the respective sense amplifier units SAU. Also vice versa, data in the sense amplifier units SAU is transferred to the latch circuits XDL and stored, and then sent through the data lines DQ and output from the semiconductor memory device 100.

<1.1.6 Configuration of Bus Select Circuit and Column Select Circuit>

Figure 5:
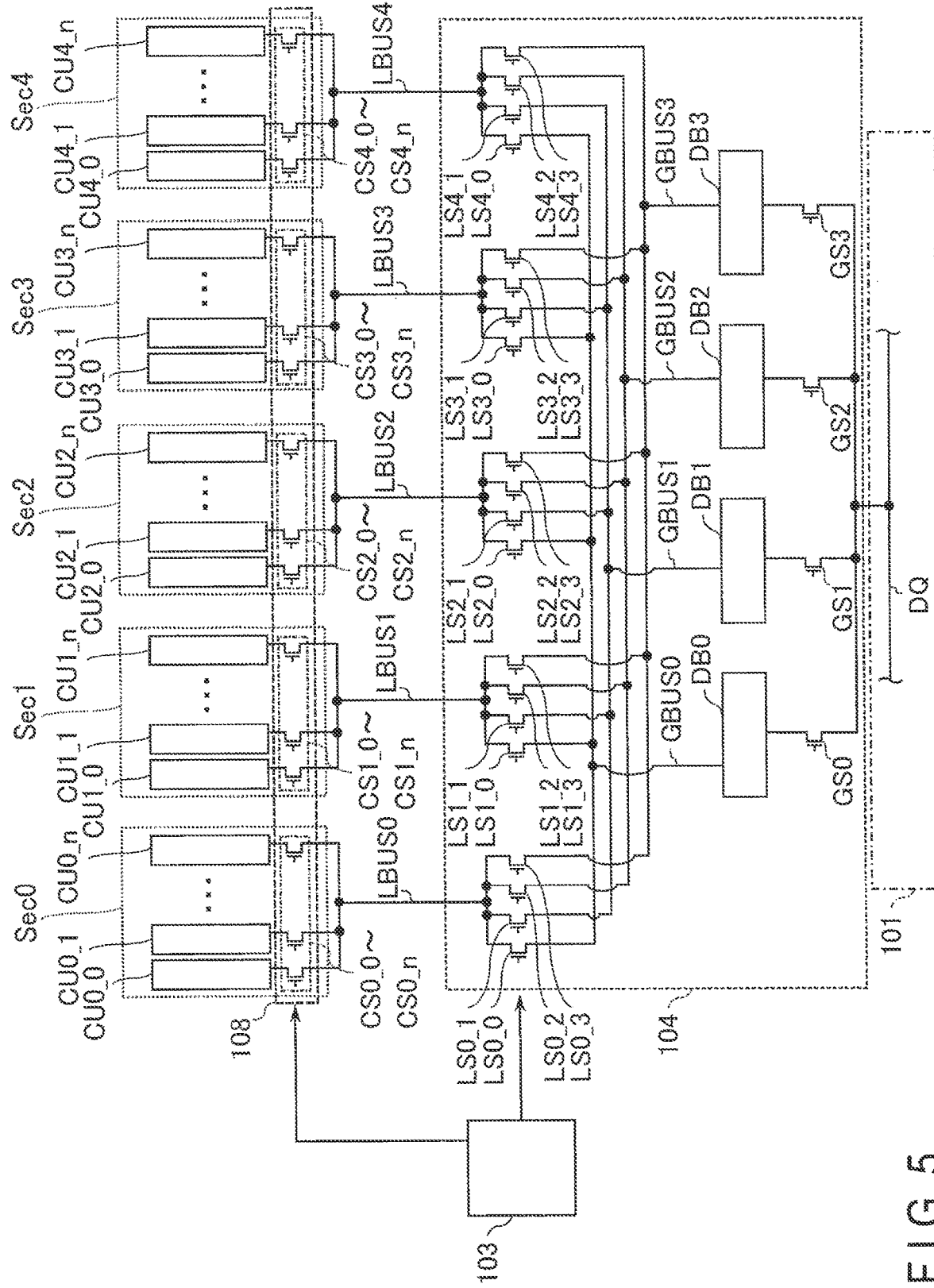
FIG. 5 is a block diagram showing an exemplary configuration of column units, an input/output circuit, a bus select circuit, and a column select circuit in the semiconductor memory device according to the first embodiment.

FIG. 5 is a block diagram showing an exemplary configuration of the column units CU, the input/output circuit 101, the bus select circuit 104, and the column select circuit 108 in the semiconductor memory device 100 according to the first embodiment.

As shown in FIG. 5, the sense amplifier module 106 and the data register 107 together include, for example, (5n+5) column units CU (CU0_0 to CU0_*n*, CU1_0 to CU1_*n*, CU2_0 to CU2_*n*, CU3_0 to CU3_*n*, and CU4_0 to CU4_*n*).

The column select circuit 108 includes (5n+5) column select switches CS (CS0_0 to CS0_*n*, CS1_0 to CS1_*n*, CS2_0 to CS2_*n*, CS3_0 to CS3_*n*, and CS4_0 to CS4_*n*).

The (5n+5) column units CU and the (5n+5) column select switches CS are grouped into five sections Sec0 to Sec4. More specifically, the column units CU0_0 to CU0_*n* and the column select switches CS0_0 to CS0_*n* are grouped as the section Sec0, the column units CU1_0 to CU1_*n* and the column select switches CS1_0 to CS1_*n* are grouped as the section Sec1, the column units CU2_0 to CU2_*n* and the column select switches CS2_0 to CS2_*n* are grouped as the section Sec2, the column units CU3_0 to CU3_*n* and the column select switches CS3_0 to CS3_*n* are grouped as the section Sec3, and the column units CU4_0 to CU4_*n* and the column select switches CS4_0 to CS4_*n* are grouped as the section Sec4.

The column select switches CS0_0 to CS0_*n* have their first ends coupled to the respective column units CU0_0 to CU0_*n*. The column select switches CS1_0 to CS1_*n* have their first ends coupled to the respective column units CU1_0 to CU1_*n*. The column select switches CS2_0 to CS2_*n* have their first ends coupled to the respective column units CU2_0 to CU2_*n*. The column select switches CS3_0 to CS3_*n* have their first ends coupled to the respective column units CU3_0 to CU3_*n*.

The column select switches CS0_0 to CS0_*n*, CS1_0 to CS1_*n*, CS2_0 to CS2_*n*, CS3_0 to CS3_*n*, and CS4_0 to CS4_*n* have their second ends coupled to the respective common local buses LBUS0 to LBUS4.

The bus select circuit 104 includes 20 local bus select switches LS (LS0_0, LS0_1, LS0_2, LS0_3, LS1_0, LS1_1, LS1_2, LS1_3, LS2_0, LS2_1, LS2_2, LS2_3, LS3_0, LS3_1, LS3_2, LS3_3, LS4_0, LS4_1, LS4_2, and LS4_3), four data buffers DB (DB0, DB1, DB2, and DB3), and four global bus select switches GS (GS0, GS1, GS2, and GS3).

The local bus select switches LS0_0 to LS0_3, LS1_0 to LS1_3, LS2_0 to LS2_3, LS3_0 to LS3_3, and LS4_0 to LS4_3 have their first ends coupled to the respective common local buses LBUS0 to LBUS4.

The local bus select switches LS0_0, LS1_0, LS2_0, LS3_0, and LS4_0 have their second ends coupled to the data buffer DB0 via a common global bus GBUS0. The local bus select switches LS0_1, LS1_1, LS2_1, LS3_1, and LS4_1 have their second ends coupled to the data buffer DB1 via a common global bus GBUS1. The local bus select switches LS0_2, LS1_2, LS2_2, LS3_2, and LS4_2 have their second ends coupled to the data buffer DB2 via a common global bus GBUS2. The local bus select switches LS0_3, LS1_3, LS2_3, LS3_3, and LS4_3 have their second ends coupled to the data buffer DB3 via a common global bus GBUS3.

The global bus select switches GS0 to GS3 have their first ends coupled to the respective data buffers DB0 to DB3, and have their second ends coupled to the common data lines DQ.

The four global bus select switches GS are configured so that an electrical connection can be discretionarily established between any one of the four global buses GBUS and the data lines DQ. As such, the number of data buffers DB conforms to the number of global buses GBUS.

The sequencer 103 is adapted to pre-store an address of the column unit CU that is defective. The sequencer 103 is thus capable of controlling each of the (5n+5) column select switches CS and the 20 local bus select switches LS independently from one another, according to the presence or absence of a defective column unit CU. In the following disclosure, the term "defective column unit CU" will refer to a column unit CU that is unusable for data transfer due to a failure in any of the latch circuits XDL, the NAND strings, and the bit lines BL, etc.

The 20 local bus select switches LS are configured so that an electrical connection can be established between any one of the four global buses GBUS and any one of the five local buses LBUS. The (n+1) column select switches CS_0 to CS_n are configured so that an electrical connection between the corresponding local bus LBUS and any one of the column units CU in the corresponding section Sec can be established. As such, the number of the sections Sec conforms to the number of the local buses LBUS.

Note that, while illustrations are omitted from FIG. 5, the column select switches CS, the local buses LBUS, the local bus select switches LS, the global buses GBUS, the data buffers DB, and the global bus select switches GS are each constituted by eight analogous components for independent connections between the eight latch circuits XDL in one column unit CU and the respective, corresponding eight data lines DQ<7:0>.

Also note that the present embodiment assumes the components provided for connections between the data lines DQ and the column units CU to be either a "local" component or a "global" component. Each "local" component is coupled to the data lines DQ via the "global" components. Each "global" component is coupled to the column units CU via the "local" components. That is, in the connections between the data lines DQ and the column units CU, the "local" components are arranged on the side closer to the column units CU than the "global" components.

<1.2 Data Transfer Operation>

Next, how data is transferred between the input/output circuit 101 and the data register 107 will be described. Examples of the data transfer operation include transferring the write data DAT provided by the memory controller 200 from the input/output circuit 101 to the latch circuits XDL in the course of a write operation, transferring the read data DAT provided by the memory cell array 105 from the latch circuits XDL to the input/output circuit 101 in the course of a read operation, and so on. The description will assume, as a concrete example of the data transfer operation, an instance of transferring the write data DAT to the latch circuits XDL in the data register 107 in the course of a write operation.

The data transfer operation in the course of a write operation is constituted by a data distribution operation and a subsequent access operation.

In the data distribution operations, the semiconductor memory device 100 controls the global bus select switches GS to periodically distribute the write data DAT from the input/output circuit 101 to the multiple data buffers DB in the bus select circuit 104.

In the access operations, the semiconductor memory device 100 controls the local bus select switches LS and the column select switches CS to simultaneously establish multiple, mutually independent connections between the data buffers DB and the respective, corresponding column units CU. Accordingly, the pieces of the write data DAT distributed to the multiple data buffers DB are transferred to different column units CU, i.e., the latch circuits XDL therein, in a parallel manner.

<1.2.1 Particulars of Data Distribution Operation>

Figure 6:
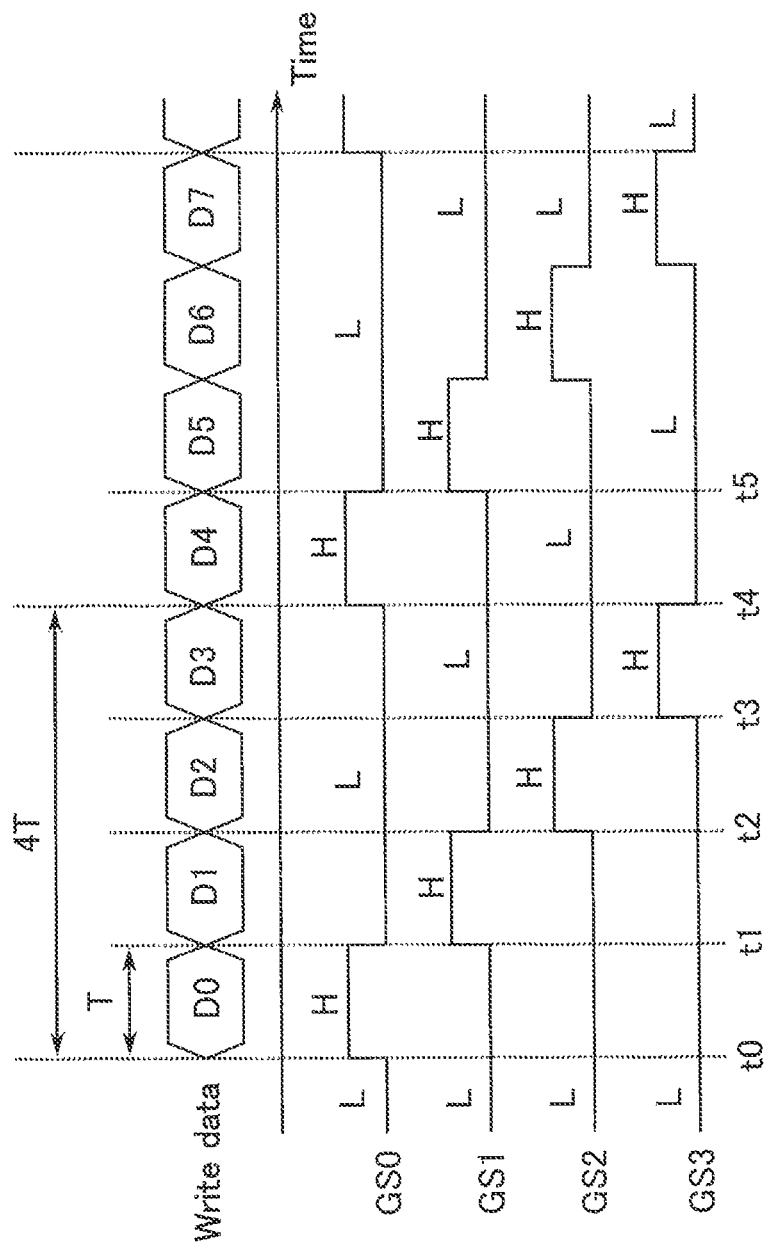
FIG. 6 is a timing chart showing an exemplary operation of the semiconductor memory device according to the first embodiment.

The data distribution operation will be described in more detail with reference to FIG. 6. FIG. 6 is a timing chart showing an exemplary operation of the semiconductor memory device 100 according to the first embodiment.

The memory controller 200 sends out the write data DAT of which unit may be defined by, for example, a data cycle T. FIG. 6 assumes an instance where the write data DAT includes multiple unit data pieces D (unit data D0 to D7), which are sent to the input/output circuit 101 in sequence at the data cycle T for each data piece for transfer to the bus select circuit 104.

In the data distribution operation, the semiconductor memory device 100 selectively turns one of the four global bus select switches GS to the on state.

More specifically, and for example, the semiconductor memory device 100 places the global bus select switch GS0 at the "H" level (in the on state) and the other global bus select switches GS1 to GS3 at the "L" level (in the off state), for the data cycle T (in FIG. 6, for the period from time t0 to time t1).

This causes the data lines DQ<7:0> to be electrically coupled to the data buffer DB0 for the period from time t0 to time t1, whereby the unit data D0 is stored in the data buffer DB0.

The semiconductor memory device 100 places the global bus select switch GS1 at the "H" level (in the on state) and the other global bus select switches GS0, GS2, and GS3 at the "L" level (in the off state), for the next data cycle T (for the period from time t1 to time t2). This causes the data lines DQ<7:0> to be electrically coupled to the data buffer DB1 for the period from time t1 to time t2, whereby the unit data D1 is stored in the data buffer DB1.

In a similar manner, the unit data D2 is stored in the data buffer DB2 using the period from time t2 to time t3, and the unit data D3 is stored in the data buffer DB3 using the period from time t3 to time t4. Then, the unit data D4 is stored in the data buffer DB0 again, using the period from time t4 to time t5.

As such, the semiconductor memory device 100 is adapted to repeat, for example, selectively turning on the global bus select switches GS0, GS1, GS2, and GS3 in this order. By doing so, the multiple unit data pieces D which are continuously (serially) transferred to the bus select circuit 104 can be distributed one by one to the four data buffers DB0 to DB3. This creates a spare time of period 4T, which runs from the commencement of storing one unit data D in one data buffer DB to the time of the next incoming unit data D, and which is 4 times longer than the data cycle T.

During this period 4T, the semiconductor memory device 100 transfers the unit data D, stored in the data buffer DB, to the latch circuits XDL in the corresponding column unit CU by the access operation as will be described. As a result, the data buffer DB is restored to the state where it can again be a part of the data distribution operation.

The semiconductor memory device 100 may, for example, complete the access operations for the unit data D0 to D3, respectively before the data buffers DB0 to DB3 store the corresponding new unit data D4 to D7.

The operational portion from storing one unit data D in one data buffer DB until transferring this unit data D to the latch circuits XDL in the corresponding column unit CU as discussed above (that is, the combination of the data distribution operation and the access operation) will be called an "operational cycle". The semiconductor memory device 100 conducts four such operational cycles for the respective data buffers DB0 to DB3 in parallel with each other, while shifting them serially (one by one) by the period of T. With this configuration, the write data DAT can be quickly transferred to the latch circuits XDL without being stocked, even in the instances where the cycle T is shorter than the time required for the operational cycle.

The semiconductor memory device 100 may repeat such operational cycles until, for example, there is no more write data DAT for transfer. For the sake of explanation, the description will use an expression "M-th operational cycle" to indicate the M-th round of the operational cycle for the data buffer DB0.

Note that the semiconductor memory device 100 is adapted to control the global bus select switches GS independently from the local bus select switches LS and the column select switches CS. That is, the data distribution operations and the access operations can be controlled independently from one another.

<1.2.2 Access Operation>

Next, the access operation will be described.

The sequencer 103 is adapted to set an order for the column units CU as destinations of the transfer of multiple unit data pieces D, in advance of performing the access operations. In the descriptions below, the order for the column units CU for the transfer of the unit data pieces D may be called an "access sequence".

The sequencer 103 controls the local bus select switches LS and the column select switches CS to conduct the access operations in the access sequence.

<1.2.2.1 Access Sequence>

A description will be given of the access sequence.

The sequencer 103 can set the access sequence so that, for example, a group of column units CU0_$k$, CU1_$k$, CU2_$k$, CU3_$k$, and CU4_$k$ will be repeated while incrementing k, where k is an integer equal to or greater than 0 and equal to or smaller than n).

That is, the sequencer 103 is capable of setting the column units CU, which are the targets of the (5k+1)th to (5k+5)th accesses, to be the column units CU0_$k$, CU1_$k$, CU2_$k$, CU3_$k$, and CU4_$k$, respectively.

FIG. 7 will be referred to for describing the access sequence more concretely. FIG. 7 is a schematic diagram for explaining an example of the write data DAT and the column units CU for storing the write data DAT. FIG. 7 shows the unit data pieces D of the write data DAT and the data buffers DB for storing the respective unit data pieces D in association with each other.

The sequencer 103, as discussed above, sets the access sequence so that the group of column units CU0_$k$, CU1_$k$, CU2_$k$, CU3_$k$, and CU4_$k$ will be repeated while incrementing k. More concretely, the sequencer 103 sets the access sequence to be the column units CU0_0, CU1_0, CU2_0, CU3_0, CU4_0, CU0_1, CU1_1, CU2_1, CU3_1, CU4_1, CU0_2, CU1_2, . . . , in advance of starting the access operations.

With this setting, for example, the unit data D0 to D3 are distributed to the data buffers DB0 to DB3 and transferred to the column units CU0_0, CU1_0, CU2_0, and CU3_0, respectively, in the first operational cycle. In the second operational cycle, the unit data D4 to D7 are distributed to the data buffers DB0 to DB3 and transferred to the column units CU4_0, CU0_1, CU1_1, and CU2_1, respectively. In the third operational cycle, the unit data D8 to D11 are distributed to the data buffers DB0 to DB3 and transferred to the column units CU3_1, CU4_1, CU0_2, and CU1_2, respectively.

<1.2.2.2 Controlling Local Bus Select Switches and Column Select Switches>

Next, how the local bus select switches and the column select switches are controlled in the access operations will be described.

The sequencer 103 in the access operation selects the local bus select switch LS so as to couple the applicable data buffer DB with the local bus LBUS corresponding to the column unit CU set in advance to be a transfer destination of the unit data D stored within said applicable data buffer DB. More specifically, for each of the four data buffers DB, the sequencer 103 turns on one of the five common local bus select switches LS having common connections to the respective data buffer DB, while turning off the other four local bus select switches LS.

The sequencer 103 in the access operation also selects the column select switch CS so as to couple the applicable local bus LBUS with the column unit CU set in advance to be a transfer destination of the unit data D. More specifically, for each of the four local buses LBUS coupled with the subject data buffer DB among the five local buses LBUS, the sequencer 103 turns on one of the (n+1) common column select switches CS belonging to the same section Sec and having common connections to the respective local bus LBUS, while turning off the other column select switches CS. Also, the sequencer 103 turns off all the (n+1) common column select switches CS belonging to the same section Sec and having common connections to, among the five local buses LBUS, the remaining local bus LBUS not coupled with the data buffers DB.

Through the above control, the sequencer 103 establishes an electrical connection through the global bus GBUS corresponding to the data buffer DB storing the write data DAT, the local bus LBUS corresponding to the preset column unit CU, and the preset column unit CU. The sequencer 103 can accordingly store the write data DAT in the preset column unit CU.

Figure 8:
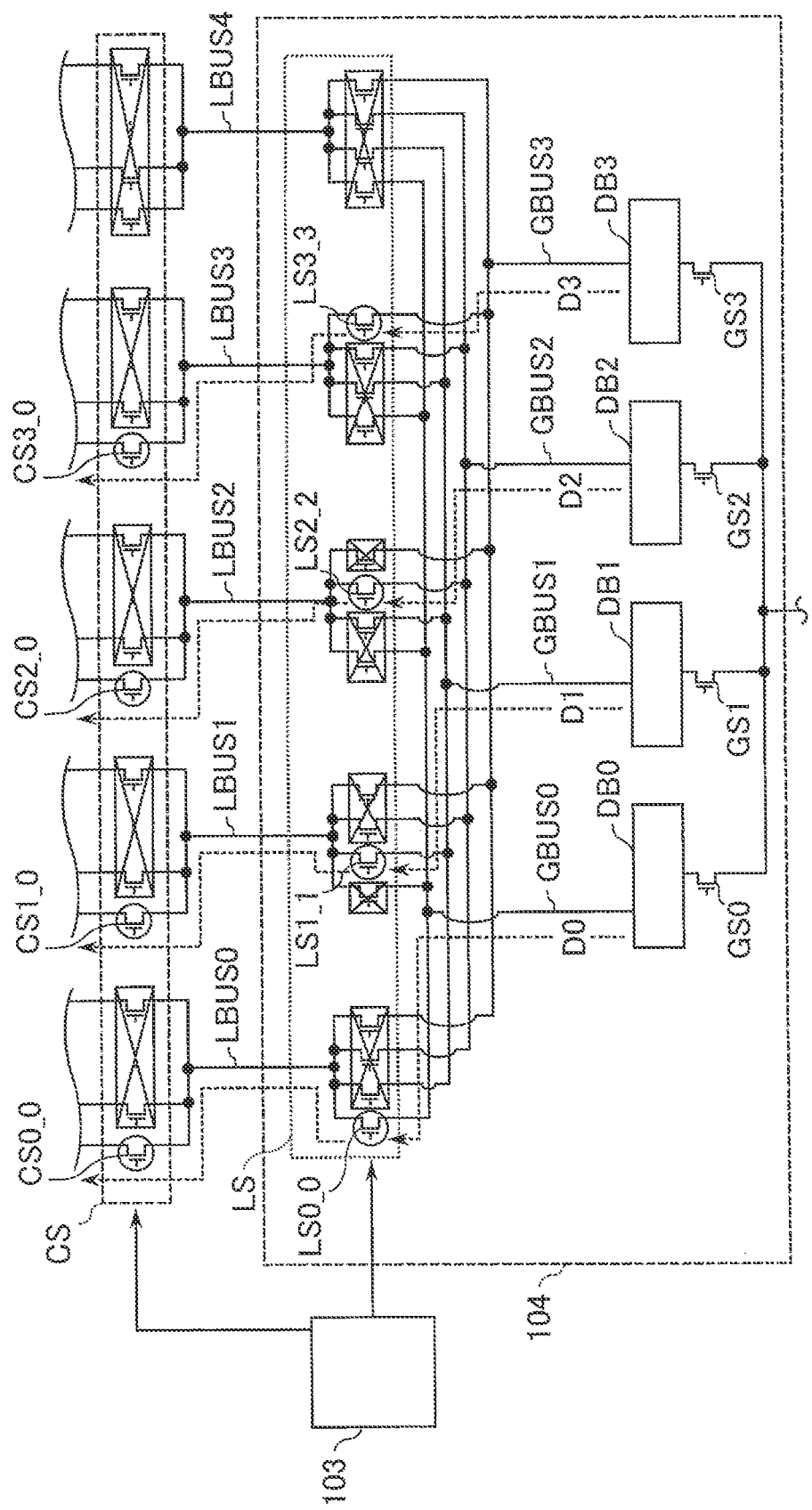
FIG. 8 is a diagram showing an exemplary form of connections for global buses, local buses, and column units in an access operation in the semiconductor memory device according to the first embodiment.

FIG. 8 will be referred to for the description using a further concrete example where the control of the local bus select switches LS and the column select switches CS is conducted upon the unit data D0 to D3 having been distributed to the respective data buffers DB0 to DB3 in the course of the first operational cycle. FIG. 8 is a diagram showing an exemplary form of connections for the global buses GBUS, the local buses LBUS, and the column units CU in the access operation in the semiconductor memory device 100 according to the first embodiment.

In order to transfer the unit data D0 stored within the data buffer DB0 to the column unit CU0_0, the sequencer 103 selects the local bus select switch LS0_0 and the column select switch CS0_0. Here, in the access operation for the unit data D0, the sequencer 103 turns on the local bus select switch LS0_0 of the local bus select switches LS having common connections to the data buffer DB0, while turning off the other local bus select switches LS1_0, LS2_0. LS3_0, and LS4_0. Also, the sequencer 103 turns on the column select switch CS0_0 of the column select switches CS grouped as the section Sec0, while turning off the other column select switches CS0_1 to CS0_$n$.

By this control, the sequencer 103 establishes an electrical connection through the global bus GBUS0, the local bus LBUS0, and the column unit CU0_0. The sequencer 103 can therefore transfer the write data piece D0 to the column unit CU0_0.

In parallel with the above control, the sequencer 103 turns on the local bus select switches LS1_1, LS2_2, and LS3_3, and turns off the other local bus select switches LS0_1 to LS0_3, LS1_2, LS1_3, LS2_1, LS2_3, LS3_1, LS3_2, and LS4_1 to LS4_3. Also, the sequencer 103 turns on the column select switches CS1_0, CS2_0, and CS3_0, and turns off the other column select switches CS1_1 to CS1_$n$, CS2_1 to CS2_$n$, CS3_1 to CS3_$n$, and CS4_0 to CS4_$n$. Accordingly, in parallel with the unit data D0 being subjected to the access operation toward the column unit CU0_0, the unit data D1 to D3 can also be subjected to the access operations toward the respective column units CU1_0, CU2_0, and CU3_0.

Subsequently in the course of the second operational cycle, the semiconductor memory device 100 performs the access operations for the unit data D4 to D7 distributed to the respective data buffers DB0 to DB3, in a similar manner to the first operational cycle.

In the access operation for the unit data D4, the sequencer 103 turns on the local bus select switch LS4_0 of the local bus select switches LS having common connections to the data buffer DB0, while turning off the other local bus select switches LS0_0, LS1_0, LS2_0, and LS3_0. Also, the sequencer 103 turns on the column select switch CS4_0 of the column select switches CS grouped as the section Sec4, while turning off the other column select switches CS4_1 to CS4_n.

By this control, the sequencer 103 can transfer the write data piece D4 to the column unit CU4_0.

In parallel with the control, the sequencer 103 turns on the local bus select switches LS0_1, LS1_2, and LS2_3, and turns off the other local bus select switches LS0_2, LS0_3, LS1_1, LS1_3, LS2_1, LS2_2, LS3_1 to LS3_3, and LS4_1 to LS4_3. Also, the sequencer 103 turns on the column select switches CS0_1, CS1_1, and CS2_1, and turns off the other column select switches CS0_0, CS0_2 to CS0_n, CS1_0, CS1_2 to CS1_n, CS2_0, CS2_2 to CS2_n, and CS3_0 to CS3_n. Accordingly, in parallel with the unit data D4 being subjected to the access operation toward the column unit CU4_0, the unit data D5 to D7 can also be subjected to the access operations toward the respective column units CU0_1, CU1_1, and CU2_1.

In each subsequent operational cycle, too, the semiconductor memory device 100 can conduct the access operations for the respective four unit data pieces D independently from each other and in parallel with each other, by controlling the local bus select switches LS and the column select switches CS in the manner as discussed above.

<1.3 Operations for Writing with Defective Column Unit>

A description will be given of the operations performed in relation to data write when there is one or more defective column units CU.

When there is a defective column unit CU, the semiconductor memory device 100 sets the access sequence of the column units CU, from which the defective column unit CU is excluded. The description will basically concentrate on the operations (for example, the setting of the access sequence) which differ from the operations performed when there are no defective column units CU, and omit analogous operations.

<1.3.1 Access Sequence>

The access sequence adopted when there is one or more defective column units CU will be described.

The sequencer 103 refers to a list stored in advance which shows the addresses of defective column units CU, and excludes (skips) the defective column units CU from the access sequence so that the access sequence consisting of the ordered normal column units CU is determined.

FIG. 9 will be used for explaining a concrete example of the access sequence adopted when there is one or more defective column units CU. FIG. 9 is a schematic diagram for explaining an example of the write data DAT and the column units CU for storing the write data DAT.

In the example shown in FIG. 9, the column units CU1_1 and CU4_0 are defective column units CU, and FIG. 9 puts a cross mark on these column units CU.

The sequencer 103 recognizes each of the column units CU0_0 to CU3_0 to be normal and sets the access sequence in this order, thereby determining the access destinations of the unit data D0 to D3 distributed to the respective data buffers DB0 to DB3 in the first operational cycle.

Then, the sequencer 103 recognizes that the column unit CU4_0, intended for the access next to the column unit CU3_0, is defective and excludes the column unit CU4_0 from the access sequence.

The sequencer 103 recognizes that the column unit CU0_1, intended for the access next to the column unit CU4_0, is normal and places the column unit CU0_1 next to the column unit CU3_0 in the access sequence.

For the subsequent column units CU, the sequencer 103 may set the access sequence while excluding defective column units CU therefrom.

In this manner, the sequencer 103 can set the access sequence of the column units CU to be the column units CU0_0, CU1_0, CU2_0, CU3_0, CU0_1, CU2_1, CU3_1, CU4_1, CU0_2, CU1_2, ..., in advance of starting the access operations.

According to this setting, the unit data D0 to D3 are, in the first operational cycle, distributed to the data buffers DB0 to DB3 and transferred to the column units CU0_0 to CU3_0, respectively. In the second operational cycle, the unit data D4 to D7 are distributed to the data buffers DB0 to DB3 and transferred to the column units CU0_1, CU2_1, CU3_1, and CU4_1, respectively. In the third operational cycle, the unit data D8 and D9 are distributed to the data buffers DB0 and DB1 and transferred to the column units CU0_2 and CU1_2, respectively.

For the subsequent column units CU, the access sequence may be set in the same manner as above.

<1.4 Effects>

According to the first embodiment, the data lines DQ are coupled to the four global buses GBUS0 to GBUS3 which are parallel to one another. The sense amplifier module 106 and the data register 107 have their components grouped into five sections Sec0 to Sec4, which are greater in number than the global buses GBUS. The sections Sec0 to Sec4 are coupled to the local buses LBUS0 to LBUS4, respectively. The local buses LBUS0 to LBUS4 are each coupled to every one of the global buses GBUS0 to GBUS3 via the multiple local bus select switches LS. The sequencer 103 is adapted to control these local bus select switches LS so that each of the sections Sec0 to Sec4 can be coupled to the data lines DQ via any of the global buses GBUS0 to GBUS3. With this configuration, four unit data pieces which are input to the global buses GBUS0 to GBUS3 in a parallel manner can be transferred to any given four of the five sections Sec0 to Sec4 within one operational cycle. As such, even when one of the four sections Sec intended to be data transfer destinations becomes inaccessible due to a defect in its column units CU, the remaining one section Sec, which has not been set as a data transfer destination, can be employed as the new data transfer destination in place of the inaccessible section Sec. The first embodiment can therefore realize rapid data input and output operations irrespective of the presence of a defective column unit CU.

The sequencer 103 is also adapted to determine the sections Sec to which the data should be transferred, after recognizing whether or not the column units CU are defective. That is, the sequencer 103 can set all the normal column units CU to be data transfer destinations, irrespective of the presence of a defective column unit CU. Thus, even when a defect occurs in any section Sec, the transfer destination can be set to another one of the sections Sec. As such, the first embodiment can improve the memory density without degrading the relief efficiency as compared to other configurations such as arranging a replacement region (redundancy region) for each section Sec and, upon occurrence of a defect, setting a new transfer destination to the redundancy region within the same section Sec where the defect has occurred. The first embodiment accordingly allows for the reduction of the area, size, etc. of the memory cell array 105 that are required for the semiconductor memory device 100 to secure a given memory capacity, as compared to the configurations which involve arranging redundancy regions.

2. Second Embodiment

A semiconductor memory device according to the second embodiment will be described. The second embodiment differs from the first embodiment in that the number of the local bus select switches LS in the bus select circuit 104 is 8 rather than 20. The description will in principle omit the configurations and operations which are the same or substantially the same as those of the first embodiment, and concentrate on configurations and operations which differ.

<2.1 Configuration>

A configuration of the semiconductor memory device 100 according to the second embodiment will be described.

FIG. 10 is a block diagram showing an exemplary configuration of the column units CU, the input/output circuit 101, the bus select circuit 104, and the column select circuit 108 in the semiconductor memory device 100 according to the second embodiment.

The sections Sec including the column units CU and the column select switches CS are each configured in the same manner as in the first embodiment.

In the semiconductor memory device 100 according to the second embodiment, the bus select circuit 104 includes eight local bus select switches LS (LS0_0, LS1_0, LS1_1, LS2_1, LS2_2, LS3_2, LS3_3, and LS4_3).

The local bus select switch LS0_0 has its first end coupled to the local bus LBUS0. The local bus select switches LS1_0 and LS1_1 have their first ends coupled to the common local bus LBUS1. The local bus select switches LS2_1 and LS2_2 have their first ends coupled to the common local bus LBUS2. The local bus select switches LS3_2 and LS3_3 have their first ends coupled to the common local bus LBUS3. The local bus select switch LS4_3 has its first end coupled to the local bus LBUS4.

The local bus select switches LS0_0 and LS1_0 have their second ends coupled to the data buffer DB0 via the common global bus GBUS0. The local bus select switches LS1_1 and LS2_1 have their second ends coupled to the data buffer DB1 via the common global bus GBUS1. The local bus select switches LS2_2 and LS3_2 have their second ends coupled to the data buffer DB2 via the common global bus GBUS2. The local bus select switches LS3_3 and LS4_3 have their second ends coupled to the data buffer DB3 via the common global bus GBUS3.

In the second embodiment, the sequencer 103 is capable of controlling each of the (5n+5) column select switches CS and the 8 local bus select switches LS independently from one another.

That is, the sequencer 103 is adapted to control the local bus select switches LS0_0 and LS1_0 so that an electrical connection between the global bus GBUS0 and the local bus LBUS0 or LBUS1 can be established. The sequencer 103 is adapted to control the local bus select switches LS1_1 and LS2_1 so that an electrical connection between the global bus GBUS1 and the local bus LBUS1 or LBUS2 can be established. The sequencer 103 is adapted to control the local bus select switches LS2_2 and LS3_2 so that an electrical connection between the global bus GBUS2 and the local bus LBUS2 or LBUS3 can be established. The sequencer 103 is adapted to control the local bus select switches LS3_3 and LS4_3 so that an electrical connection between the global bus GBUS3 and the local bus LBUS3 or LBUS4 can be established.

<2.2 Data Transfer Operation>

The data transfer operation in the semiconductor memory device 100 according to the second embodiment will be described.

According to the second embodiment, the semiconductor memory device 100 sets an access sequence involving changes or reordering from the access sequence of the first embodiment.

<2.2.1 Access Sequence>

How to set the access sequence of the column units CU will be described. For the sake of explanation, the description will assume instances where there are no defective column units CU.

The sequencer 103 first sets the access sequence of all the column units CU in the same manner as discussed for the first embodiment with reference to FIG. 7. Then, for the sections Sec ($Seci_{4j+1}$, $Seci_{4j+2}$, $Seci_{4j+3}$, and $Seci_{4j+4}$) corresponding to the respective column units CU that come in the (4j+1)th to (4j+4)th positions in the access sequence for the (j+1)th operational cycle (j being an integer equal to or greater than 0), the sequencer 103 makes a determination based on the relationship in size of their section numbers as represented by $i_{4j+1} < i_{4j+2} < i_{4j+3} < i_{4j+4}$ (values $i_{4j+1}$ to $i_{4j+4}$ each differing from the others and each being an integer equal to or greater than 0 and equal to or smaller than 4). More specifically, the sequencer 103 checks if the four section numbers $i_{4j+1}$ to $i_{4j+4}$, assigned to these sections Sec, meet the relationship $i_{4j+1} < i_{4j+2} < i_{4j+3} < i_{4j+4}$ ("section condition").

If the section numbers $i_{4j+1}$ to $i_{4j+4}$ meet the section condition, the sequencer 103 determines that the reordering is not to be performed, and sets the access sequence of the (4j+1)th to (4j+4)th column units CU in this order.

If the section numbers $i_{4j+1}$ to $i_{4j+4}$ do not meet the section condition, the sequencer 103 determines that the reordering should be performed, and changes the access sequence of the (4j+1)th to (4j+4)th column units CU so that the section numbers $i_{4j+1}$ to $i_{4j+4}$ are arranged in an ascending order.

FIG. 11 will be used for explaining concretely how the access sequence of the column units CU may be set in the second embodiment. FIG. 11 is a schematic diagram for explaining an example of the write data DAT and the column units CU for storing the write data DAT.

As shown in FIG. 11, the sequencer 103 first sets the access sequence as in the first embodiment where no defective components are assumed (in FIG. 11, the row of column units CU indicated by "Column units (first embodiment)").

Subsequently, the sequencer 103 determines the relationship in size of the section numbers $i_1$ to $i_4$ corresponding to the respective column units CU0_0 to CU3_0 that come in the 1st to 4th positions in the access sequence for the first operational cycle. Here, the section numbers $i_1$ to $i_4$ are 0, 1, 2, and 3, respectively, and meet the section condition ($i_1 < i_2 < i_3 < i_4$). Accordingly, the sequencer 103 sets the access sequence of the column units CU0_0 to CU3_0 in this order.

Next, the sequencer 103 determines the relationship in size of the section numbers $i_5$ to $i_8$ corresponding to the respective column units CU4_0 to CU2_1 that come in the 5th to 8th positions in the access sequence for the second operational cycle. The section numbers $i_5$ to $i_8$ are 4, 0, 1, and 2, respectively, and do meet the section condition ($i_5 < i_6 < i_7 < i_8$). Accordingly, the sequencer 103 changes the access sequence of the 5th to 8th column units CU so that the section numbers $i_5$ to $i_8$ are arranged in an ascending order (namely, in the order of the column units CU0_1, CU1_1, CU2_1, and CU4_0).

In this manner, the sequencer 103 presets the access sequence to be the column units CU0_0, CU1_0, CU2_0, CU3_0, CU0_1, CU1_1, CU2_1, CU4_0, CU0_2, CU1_2, CU3_1, CU4_1, . . . .

Note that while FIG. 11 shows an example where there are no defective column units CU, the access sequence can also be set likewise in the instances where one or more defective column units CU exist.

<2.3 Effects>

According to the second embodiment, for example, the second operational cycle's transfer destinations of the unit data D4 to D7 distributed to the respective data buffers DB0 to DB3 are originally the respective column units CU4_0, CU0_1, CU1_1, and CU2_1, but are set to the CU0_1, CU1_1, CU2_1, and CU4_0 after the reordering. In this case, as such, while the data transfer originally required the data buffers DB0 to DB3 to be coupled to the respective local buses LBUS4, LBUS0, LBUS1, and LBUS2, the connections of the data buffers DB0 to DB3 after the reordering are made with the LBUS0, LBUS1, LBUS2, and LBUS4, respectively.

Conducting the reordering for each cycle in this manner can regulate the form of connections so that the data buffer DB0 is coupled with either the local bus LBUS0 or LBUS1, the data buffer DB1 is coupled with either the local bus LBUS1 or LBUS2, the data buffer DB2 is coupled with either the local bus LBUS2 or LBUS3, and the data buffer DB3 is coupled with either the local bus LBUS3 or LBUS4. That is, the second embodiment can omit the structures or configurations for the data buffer DB0 to be coupled with any of the local buses LBUS2 to LBUS4, those for the data buffer DB1 to be coupled with any of the local buses LBUS0, LBUS3, and LBUS4, those for the data buffer DB2 to be coupled with any of the local buses LBUS0, LBUS1, and LBUS4, and those for the data buffer DB3 to be coupled with any of the local buses LBUS0 to LBUS2. Therefore, the second embodiment allows for the reduction of the size, area, etc. of the sequencer 103.

3. Modification

Note that the foregoing first and second embodiments do not pose limitations, and various modifications may be made.

For example, at the time of setting the access sequence, one or more normal column units CU may be tentatively handled as defective column units CU (placed in a pseudo-defective state) to adjust the number of defective column units CU appearing in one operational cycle. The description will basically concentrate on the operations (for example, the setting of the access sequence) which differ from those performed when there are no defective column units CU, and omit analogous operations according to the first embodiment.

<3.1 Access Sequence>

Figure 12:
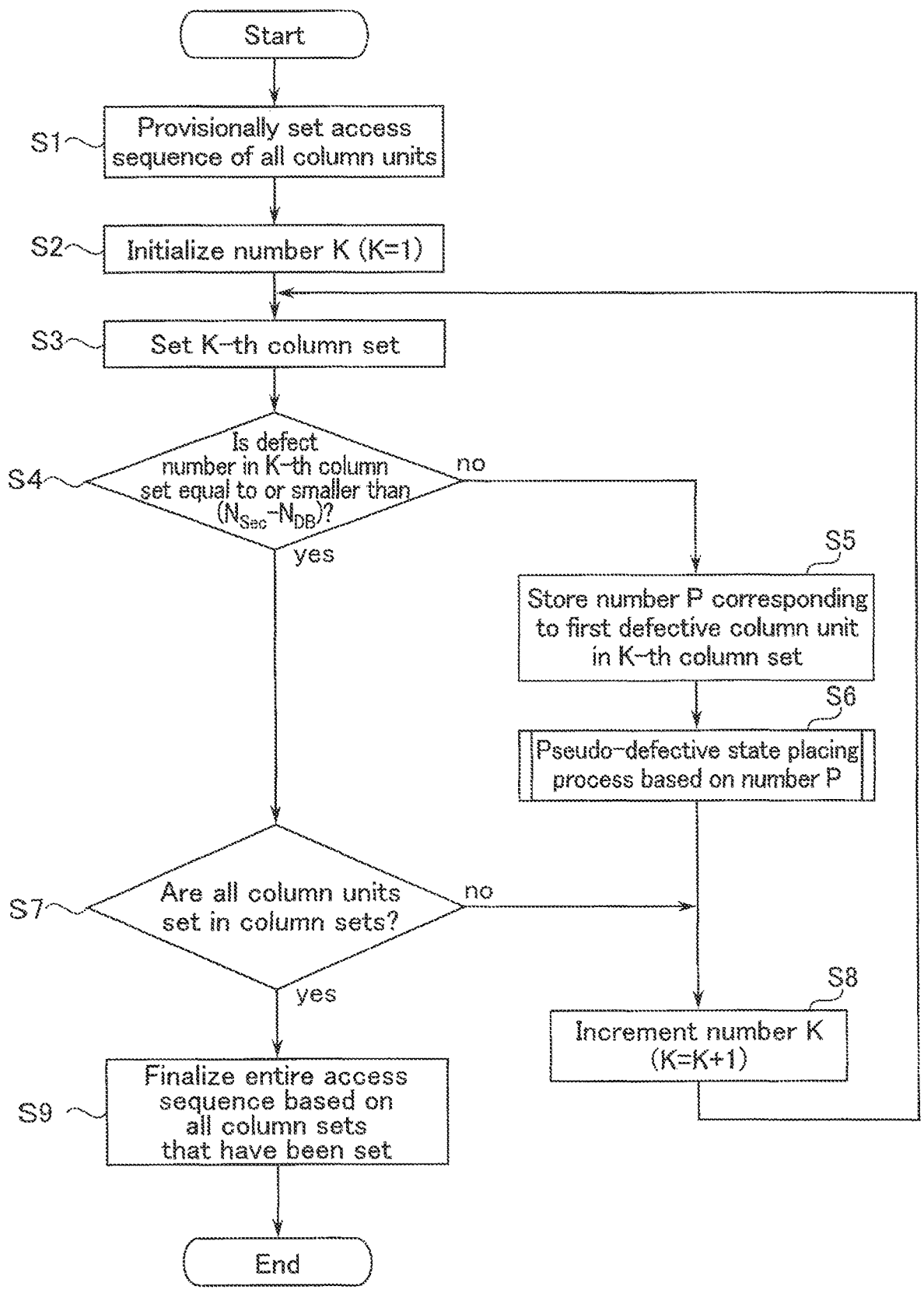
FIG. 12 is a flowchart for explaining an exemplary method for determining an access sequence in a modification.

FIG. 12 is a flowchart for explaining an exemplary method for setting the access sequence in the semiconductor memory device according to such a modification. In the descriptions below, a set including column units CU subjected to the parallel access operations in the K-th cycle may be called a "K-th column set".

First, in step S1, the sequencer 103 provisionally sets the access sequence of all the column units CU in the same manner as discussed for the first embodiment with reference to FIG. 7. The access sequence in step S1 need not take into consideration the presence of defective column units CU.

In step S2, the sequencer 103 initializes the number K to 1 (K being a natural number).

In step S3, the sequencer 103 sets the K-th column set. More specifically, the sequencer 103 sets, as the K-th column set, column units CU including $N_{DB}$ normal column units CU ($N_{DB}$ being the number of the data buffers DB), starting from the column unit CU that is the access destination next to the last column unit CU in the (K−1)th column set. There may be a given number of defective column units CU somewhere between the $N_{DB}$ normal column units CU.

However, for the sake of explanation, the first column unit CU in every column set will be assumed to be normal. In other words, when the column unit CU that is the access destination next to the last normal column unit CU in the K-th column set is defective, such a defective column unit CU is handled as a member of the K-th column set.

In step S4, the sequencer 103 checks whether or not the number of the defective column units CU (defect number) included in the K-th column set is equal to or smaller than the difference between the number $N_{Sec}$ of the sections Sec and the number $N_{DB}$ of the data buffers DB ($N_{Sec}-N_{DB}$). If the defect number is equal to or smaller than the difference ($N_{Sec}-N_{DB}$) (step S4; yes), the processing flow advances to step S7, and if not (step S4; no), the processing flow advances to step S5.

In step S5, the sequencer 103 stores information of a number P corresponding to the first defective column unit CU included in the K-th column set. More specifically, the sequencer 103 memorizes, as the number P, the number of normal column units CU present up to the first defective column unit CU included in the K-th column set.

In step S6, the sequencer 103 performs a pseudo-defective state placing process for the column units CU based on the number P. This pseudo-defective state placing process based on the number P is a process to tentatively handle P normal column units CU as defective column units CU, so as to avoid an event that the number of defective column units CU included in one column set exceeds the difference ($N_{Sec}-N_{DB}$). The pseudo-defective state placing process based on the number P will be described in more detail. Upon completion of step S6, the processing flow advances to step S8.

In step S7, the sequencer 103 determines whether or not all the column units CU have been set in the column sets. If there is an unset column unit CU (step S7; no), the processing flow advances to step S8. If all the column units CU have been set in the column sets, the processing flow advances to step S9.

In step S8, the sequencer 103 increments the number K (K=K+1), and the processing flow returns to step S3. In the above manner, the sequencer 103 repeats steps S3 to S8 until it is determined in step S7 that all the column units CU have been set in the column sets.

In step S9, the sequencer 103 finalizes the access sequence of the column units CU based on all the column sets that have been set so that the access sequence will be applied to the subsequent data transfer operation.

In addition, the processing flow may further include, for example, determining in step S4 whether or not the defect number in the subject column set is larger than a predetermined number $N_{thr}$, where $N_{thr}$ is an integer larger than the difference ($N_{Sec}-N_{DB}$), e.g., the value obtained by ($N_{Sec}-N_{DB}$)+2. If it is determined that the defect number is larger than the predetermined number $N_{thr}$, the sequencer 103 terminates the operation of setting the access sequence, deeming that the defective chip is being used.

Figure 13:
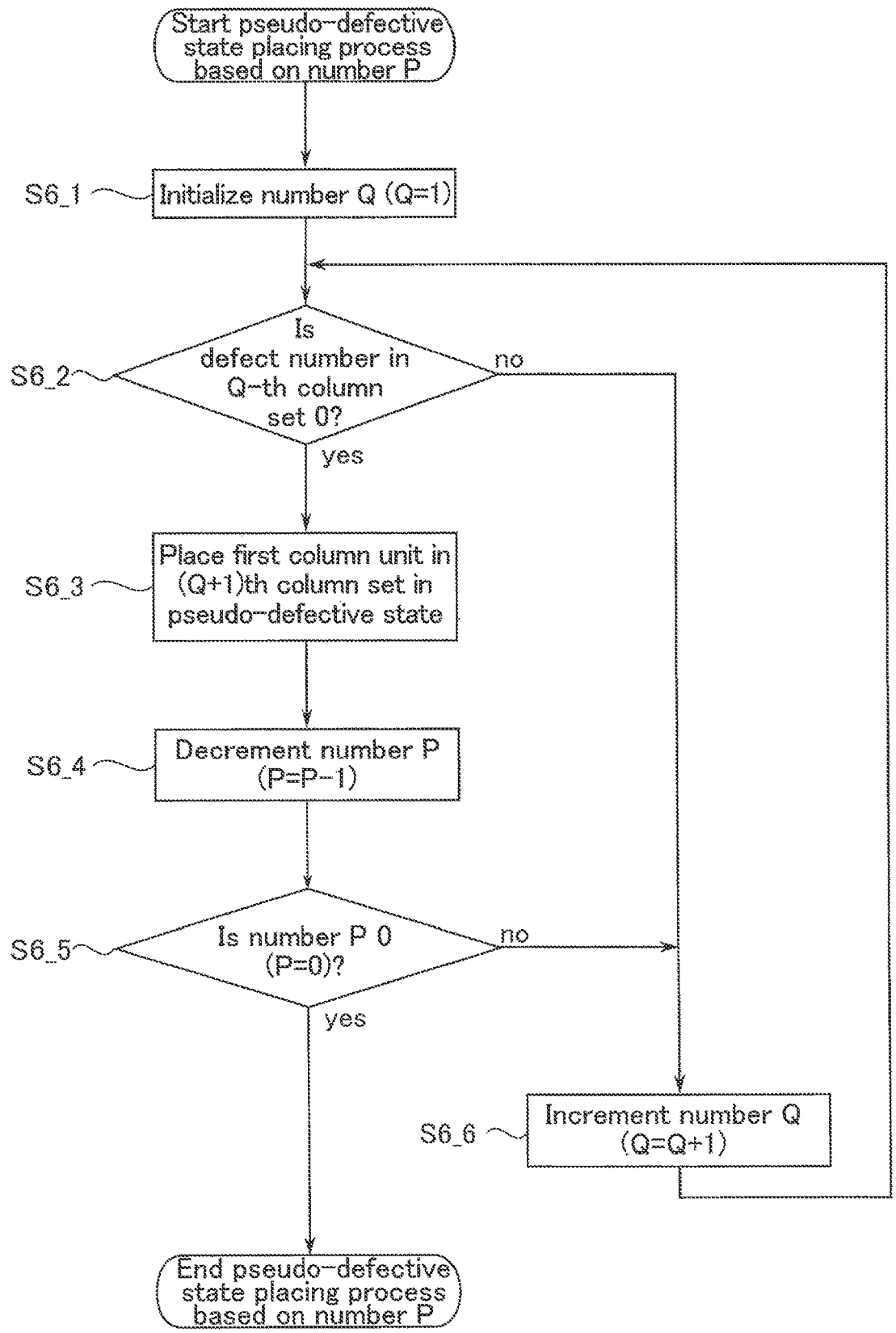
FIG. 13 is a flowchart for explaining an exemplary method for placing one or more column units in a pseudo-defective state in the modification.

Now, the pseudo-defective state placing process performed in step S6 based on the number P will be described in detail, with reference to the flowchart in FIG. 13.

Step S6_1 is performed first, where the sequencer 103 initializes a number Q to 1 (Q being a natural number).

Then in step S6_2, the sequencer 103 determines whether or not the defect number in the Q-th column set is 0. If the defect number in the Q-th column set is 0 (step S6_2; yes), the processing flow advances to step S6_3, and if not (step S6_2; no), the processing flow advances to step S6_6.

In step S6_3, the sequencer 103 places the first column unit CU in the (Q+1)th column set in a pseudo-defective state. The sequencer 103 thus handles this column unit CU placed in the pseudo-defective state as the last column unit CU in the preceding Q-th column set. Together, the sequencer 103 handles the column unit CU that is the access destination next to the column unit CU placed in the pseudo-defective state, as the first column unit CU in the (Q+1)th column set, and sets again the (Q+1)th to K-th column sets accordingly.

In step S6_4, the sequencer 103 decrements the number P (P=P−1).

In step S6_5, the sequencer 103 determines whether or not the number P is 0. That is, what is determined here is whether or not there is a remaining column unit CU to be placed in the pseudo-defective state. If the number P is not 0 (step S6_5; no), the processing flow advances to step S6_6, and if the number P is 0 (step S6_5; yes), the pseudo-defective state placing process based on the number P is complete.

In step S6_6, the sequencer 103 increments the number Q (Q=Q+1), and the processing flow returns to step S6_2. In the above manner, the sequencer 103 repeats steps S6_2 to S6_6 until it is determined in step S6_5 that the number P has reached 0.

As a result of the pseudo-defective state placing process based on the number P that proceeds in the above manner, P column units CU are placed in the pseudo-defective state.

Additionally, if the access sequence cannot be set by the above-described access sequence setting method, the sequencer 103 may terminate the operation of setting the access sequence, deeming that the defective chip is being used.

Figure 14:
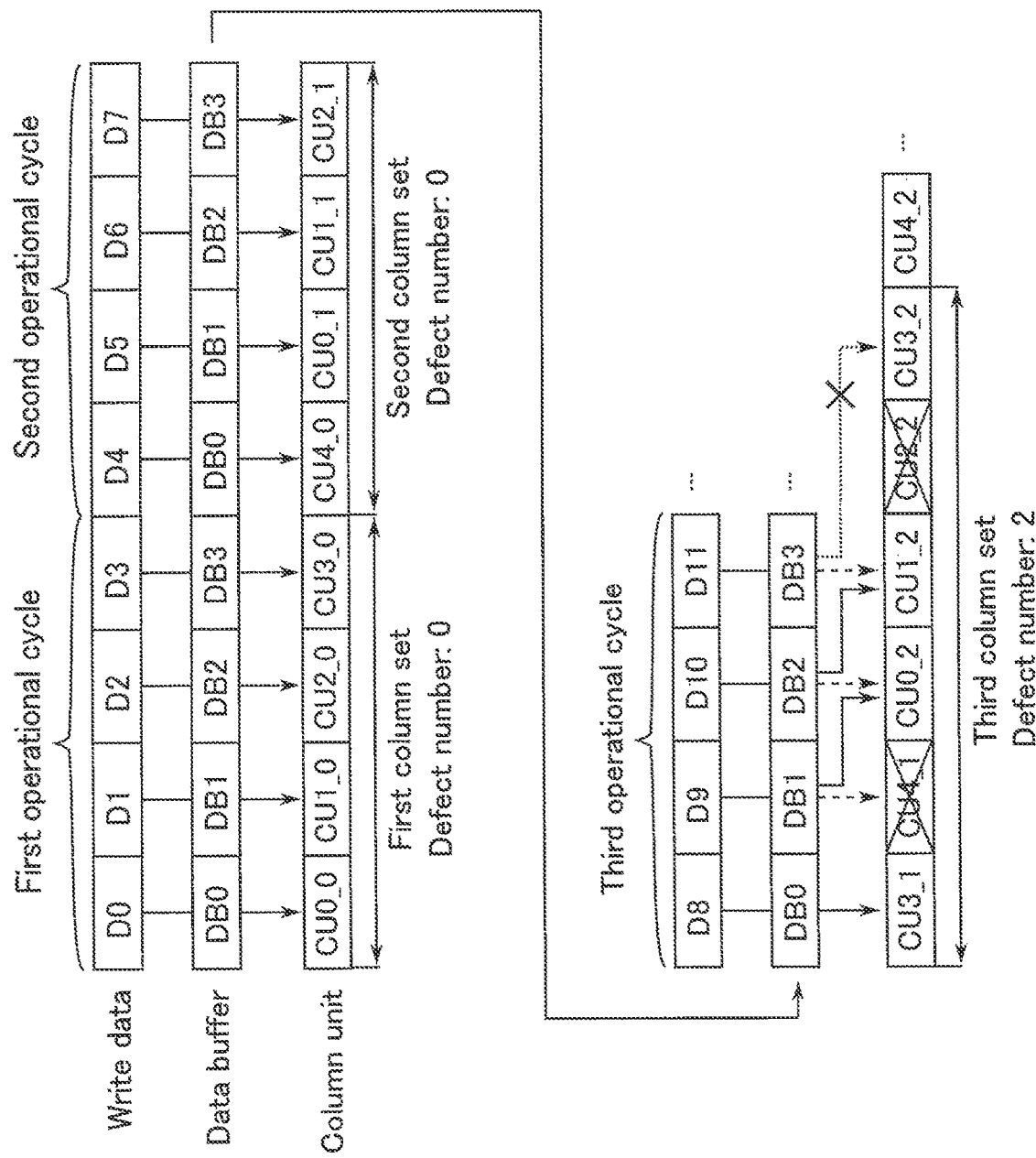
FIG. 14 is a schematic diagram for explaining an example of write data and column units for storing the write data, which are before a pseudo-defective state placing process according to the modification.
Figure 15:
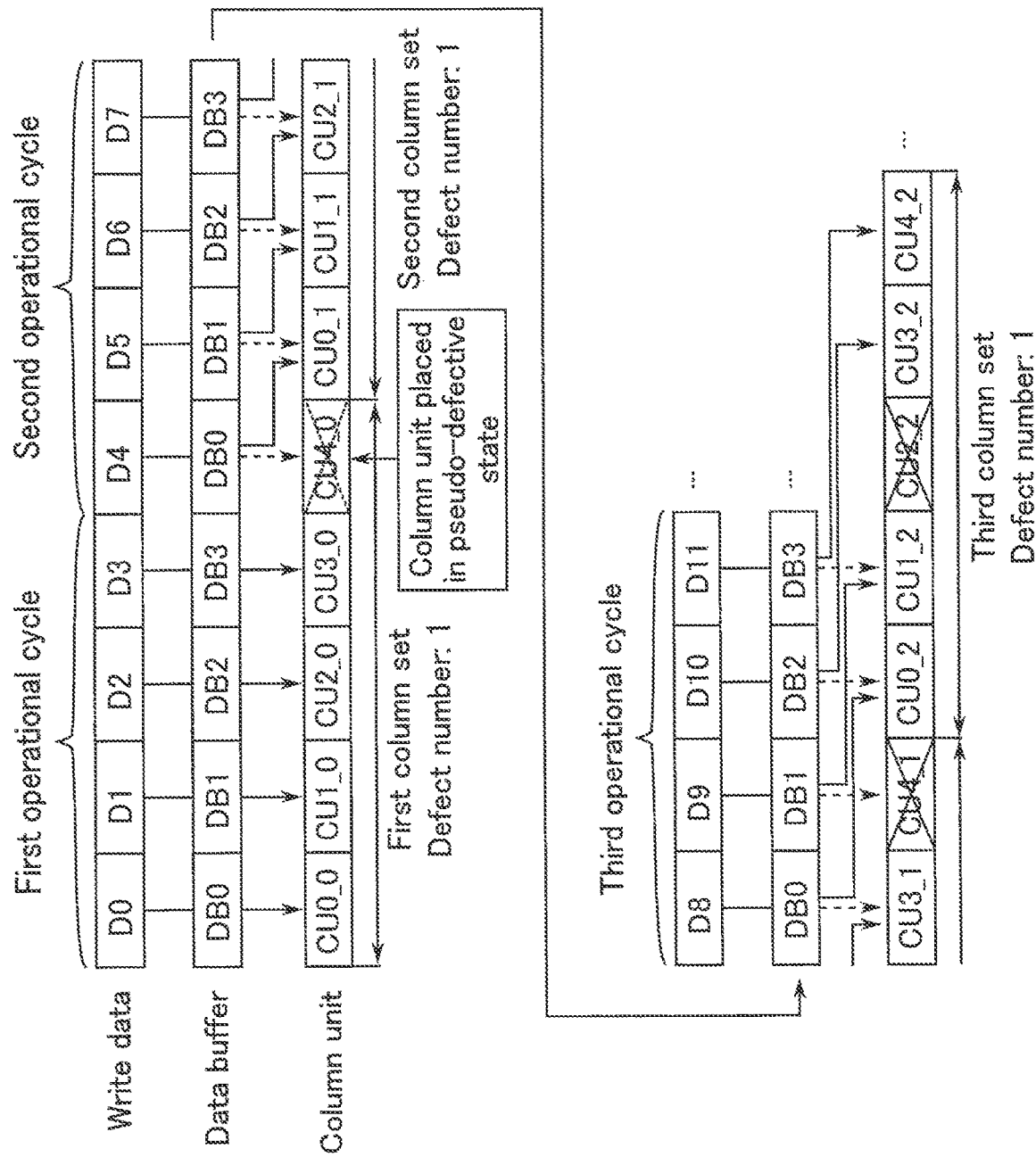
FIG. 15 is a schematic diagram for explaining an example of write data and column units for storing the write data, which are after the pseudo-defective state placing process according to the modification.

FIGS. 14 and 15 will be used for explaining a concrete example of the access sequence setting method involving the pseudo-defective state placing process in the semiconductor memory device according to the modification. FIGS. 14 and 15 each are a schematic diagram for explaining an example of the write data and the column units for storing the write data, and illustrate them in the state before step S6 in FIG. 12 and the state after the same, respectively.

The example below will assume the number $N_{Sec}$ of the sections Sec to be 5, and the number $N_{DB}$ of the data buffers DB to be 4.

First, the sequencer 103 provisionally sets the access sequence as in the first embodiment where no defective components are assumed (in FIGS. 14 and 15, the row of column units CU). In the example shown in FIGS. 14 and 15, the column units CU2_2 and CU4_1 are defective column units CU and they are marked with a cross in FIGS. 14 and 15.

The sequencer 103 then sets four normal column units CU0_0 to CU3_0 in the first column set. The first column set has a defect number 0, which is smaller than the value $(N_{Sec}-N_{DB})$. The process thus proceeds to the setting of the second column set.

The sequencer 103 sets four normal column units CU4_0 to CU2_1 in the second column set. The second column set has a defect number 0, which is smaller than the value $(N_{Sec}-N_{DB})$. The process thus proceeds to the setting of the third column set.

The sequencer 103 sets four normal column units CU3_1, CU0_2, CU1_2, and CU3_2, and two defective column units CU4_1 and CU2_2 in the third column set. The third column set has a defect number 2, which is larger than the value $(N_{Sec}-N_{DB})$. The sequencer 103 accordingly performs the pseudo-defective state placing process based on the number P corresponding to the first defective column unit CU4_1 in the third column set. The number P is, for example, the number of column units CU from the start of the third column set up to the defective column unit CU4_1 (exclusive of this column unit CU4_1) in the same set, and P is 1 in the example shown in FIG. 14. As such, the sequencer 103 in the pseudo-defective state placing process tentatively handles one column unit CU as a defective column unit CU, based on the number P (=1).

More specifically, the sequencer 103 determines the defect number in the first column set to be 0 and, as shown in FIG. 15, places the first column unit CU4_0 in the second column set in a pseudo-defective state. This column unit CU4_0 placed in the pseudo-defective state is thus handled as the last column unit CU in the first column set, and the normal column unit CU0_1 is handled as the first column unit CU in the second column set. FIG. 15 puts a cross mark consisting of dashed lines on the column unit CU4_0 placed in the pseudo-defective state.

Subsequently, the sequencer 103 sets four normal column units CU0_1, CU1_1, CU2_1, and CU3_1, and one defective column unit CU4_1 in the second column set, and sets four normal column units CU0_2, CU1_2, CU3_2, and CU4_2, and one defective column unit CU2_2 in the third column set.

In this manner, the sequencer 103 performs the setting of the column sets until there are no remaining column units CU which are unset in the column sets. Upon completion of the setting of the column sets, the sequencer 103 finalizes, based on all of these column sets, the access sequence by excluding therefrom the column units CU that have been placed in the pseudo-defective state as well as the defective column units CU.

Therefore, the sequencer 103 can set the access sequence of the column units CU to be the column units CU0_0, CU1_0, CU2_0, CU3_0, CU0_1, CU1_1, CU2_1, CU3_1, CU0_2, CU1_2, CU3_2, CU4_2, . . . , in advance of starting the access operations.

Note that the foregoing description of the modification has assumed the data transfer operation using the semiconductor memory device 100 according to the first embodiment, but the pseudo-defective state placing process is likewise applicable to the use of the semiconductor memory device 100 according to the second embodiment. One exemplary implementation may be the setting of, as an interim sequence, the access sequence by performing the pseudo-defective state placing process as described above, and then setting the final access sequence by reordering the column units CU in the same manner as discussed for the second embodiment with reference to FIG. 11.

<3.2 Effects>

According to the modification, the sequencer 103 is adapted to perform the pseudo-defective state placing process upon detecting a column set that has a defect number not equal to or smaller than the threshold (section number $N_{Sec}$–data buffer number $N_{DB}$). In this pseudo-defective state placing process, the column unit CU, which is at the start of the column set that is next to the one having a defect number 0 among the column sets preceding the one detected, is placed in a pseudo-defective state by the sequencer 103. The sequencer 103 is adapted to repeat the pseudo-defective state placing process as many times as the number P corresponding to the first defective column unit in the detected column set. This enables for regulation of the number of the defective column units CU that can be present in one column set to be equal to or less than the number of sections (section number $N_{Sec}$–data buffer number $N_{DB}$) that can function as redundancy regions in one operational cycle. That is, the modification provides a preventive measure for the memory cell array 105 as a whole not to fall into an unusable situation by placing some of the normal column units CU in a pseudo-defective state. The modification therefore allows for efficient use of the memory cell array 105.

4. Others

The first embodiment and the second embodiment have assumed the configurations where the column select circuit 108 and the data lines DQ<7:0> are coupled via five local buses LBUS and four global buses GBUS, but this is not a limitation. For example, the number of the local buses LBUS may be discretionarily determined as long as it is greater than the number of the global buses GBUS. Also, the number of the global buses GBUS is not limited to four but may be discretionarily determined.

The first embodiment, the second embodiment, and the modification have been described using examples where four operational cycles are performed in parallel with each other while being serially shifted by the period of T. However, the number of operational cycles performed in parallel is not limited to four but may be discretionarily changed. For this purpose, the circuit configuration may be designed with any appropriate numbers of the local buses LBUS and the global buses GBUS as described above, so that the desired number of operational cycles can be performed in parallel.

The first embodiment and the second embodiment have assumed the configurations where the semiconductor memory device 100 includes the data buffers DB, but the embodiments are not limited to such configurations and the data buffers DB may be omitted. In this case, for example, the semiconductor memory device 100 in the data distribution operations may transfer the unit data D to the latch circuits XDL in the corresponding column unit CU in the manner similar to the access operations, instead of storing the unit data D in the data buffers DB.

Additionally, the foregoing embodiments, etc., have been described using the examples where the write data DAT is written into the semiconductor memory device 100. What is described for the embodiments, etc. is also applicable to data read operations. For the data read operations, data is read in the unit of page and stored in the latch circuits XDL in the unit of column unit CU. The read data is then output from the latch circuits XDL via the respective data lines DQ. At this time, the latch circuits XDL from which the data should be read, that is, which column select switch CS, local bus select switch LS, and global bus select switch GS should be turned on, can be controlled using the same method as in the data write operations.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device including:
a first string including a first memory cell transistor and a second memory cell transistor which are coupled in series;
a first switch element;
a first latch circuit coupled in series between a first end of the first string and a first end of the first switch element;
a second switch element and a third switch element coupled in parallel between a second end of the first switch element and a data bus;
a second string including a third memory cell transistor and a fourth memory cell transistor which are coupled in series;
a fourth switch element;
a second latch circuit coupled in series between a first end of the second string and a first end of the fourth switch element;
a third string including a fifth memory cell transistor and a sixth memory cell transistor which are coupled in series;
a fifth switch element;
a third latch circuit coupled in series between a first end of the third string and a first end of the fifth switch element;
a sixth switch element including a first end coupled to the second end of the first switch element, and a second end coupled to a first end of the second switch element;
a seventh switch element including a first end coupled to the second end of the first switch element in common with the first end of the sixth switch element, and a second end coupled to a first end of the third switch element;
an eighth switch element including a first end coupled to a second end of the fourth switch element, and a second end coupled to the first end of the second switch element in common with the second end of the sixth switch element; and
a ninth switch element including a first end coupled to a second end of the fifth switch element, and a second end coupled to the first end of the third switch element in common with the second end of the seventh switch element.

2. The device of claim 1, further including a control circuit configured to conduct a first operation of accessing the first latch circuit and the second latch circuit in parallel, a second operation of accessing the second latch circuit and the third latch circuit in parallel, and a third operation of accessing the first latch circuit and the third latch circuit in parallel,
wherein the control circuit is configured to:
in the first operation, turn on the seventh switch element and the eighth switch element, while turning off the sixth switch element and the ninth switch element;

in the second operation, turn on the eighth switch element and the ninth switch element, while turning off the sixth switch element and the seventh switch element; and in the third operation, turn on the sixth switch element and the ninth switch element, while turning off the seventh switch element and the eighth switch element.

3. The device of claim 2, wherein the control circuit is configured to:

in the first operation, transfer first data from the data bus to the first latch circuit via the third switch element, while transferring second data from the data bus to the second latch circuit via the second switch element;

in the second operation, transfer third data from the data bus to the second latch circuit via the second switch element, while transferring fourth data from the data bus to the third latch circuit via the third switch element; and in the third operation, transfer fifth data from the data bus to the first latch circuit via the second switch element, while transferring sixth data from the data bus to the third latch circuit via the third switch element.

4. The device of claim 2, wherein the control circuit is configured to:

switch from the first operation to the second operation when a first condition is satisfied, and switch from the first operation to the third operation when a second condition is satisfied.

5. The device of claim 4, wherein:

the first condition includes the first string or the first latch circuit being defective, and the second condition includes the second string or the second latch circuit being defective.

6. The device of claim 1, further including:

a tenth switch element including a first end coupled to the second end of the fourth switch element in common with the first end of the eighth switch element, and a second end coupled to the first end of the third switch element in common with the second end of the seventh switch element and the second end of the ninth switch element; and an eleventh switch element including a first end coupled to the second end of the fifth switch element in common with the first end of the ninth switch element, and a second end coupled to the first end of the second switch element in common with the second end of the sixth switch element and the second end of the eighth switch element.

7. The device of claim 6, further including a control circuit configured to conduct a first operation of accessing the first latch circuit and the second latch circuit in parallel, a second operation of accessing the second latch circuit and the third latch circuit in parallel, and a third operation of accessing the first latch circuit and the third latch circuit in parallel, wherein the control circuit is configured to:

in the first operation, turn on one of the sixth switch element and the seventh switch element and one of the eighth switch element and the tenth switch element, while turning off a remaining one of the sixth switch element and the seventh switch element, a remaining one of the eighth switch element and the tenth switch element, the ninth switch element, and the eleventh switch element;

in the second operation, turn on one of the eighth switch element and the tenth switch element and one of the ninth switch element and the eleventh switch element, while turning off a remaining one of the eighth switch element and the tenth switch element, a remaining one of the ninth switch element and the eleventh switch element, the sixth switch element, and the seventh switch element; and in the third operation, turn on one of the sixth switch element and the seventh switch element and one of the ninth switch element and the eleventh switch element, while turning off a remaining one of the sixth switch element and the seventh switch element, a remaining one of the ninth switch element and the eleventh switch element, the eighth switch element, and the tenth switch element.

8. The device of claim 7, wherein the control circuit is configured to, in the first operation:

turn on the tenth switch element, while turning off the seventh switch element and the eighth switch element, when the control circuit turns on the sixth switch element, and turn on the eighth switch element, while turning off the sixth switch element and the tenth switch element, when the control circuit turns on the seventh switch element.

9. The device of claim 7, wherein the control circuit is configured to, in the first operation:

turn on a set including the sixth switch element and the tenth switch element, when the control circuit transfers first data from the data bus to the first latch circuit via the second switch element, while transferring second data from the data bus to the second latch circuit via the third switch element, and turn on a set including the seventh switch element and the eighth switch element, when the control circuit transfers the first data from the data bus to the first latch circuit via the third switch element, while transferring the second data from the data bus to the second latch circuit via the second switch element.

10. The device of claim 9, wherein the first data and the second data are serially transferred in the data bus.

11. The device of claim 7, wherein the control circuit is configured to, in the second operation:

turn on the ninth switch element, while turning off the tenth switch element and the eleventh switch element, when the control circuit turns on the eighth switch element, and turn on the eleventh switch element, while turning off the eighth switch element and the ninth switch element, when the control circuit turns on the tenth switch element.

12. The device of claim 7, wherein the control circuit is configured to, in the second operation:

turn on a set including the eighth switch element and the ninth switch element, when the control circuit transfers third data from the data bus to the second latch circuit via the second switch element, while transferring fourth data from the data bus to the third latch circuit via the third switch element, and turn on a set including the tenth switch element and the eleventh switch element, when the control circuit transfers the third data from the data bus to the second latch circuit via the third switch element, while transferring the fourth data from the data bus to the third latch circuit via the second switch element.

13. The device of claim 12, wherein the third data and the fourth data are serially transferred in the data bus.

14. The device of claim 7, wherein the control circuit is configured to, in the third operation:
- turn on the ninth switch element, while turning off the seventh switch element and the eleventh switch element, when the control circuit turns on the sixth switch element, and
- turn on the eleventh switch element, while turning off the sixth switch element and the ninth switch element, when the control circuit turns on the seventh switch element.

15. The device of claim 7, wherein the control circuit is configured to, in the third operation:
- turn on a set including the sixth switch element and the ninth switch element, when the control circuit transfers fifth data from the data bus to the first latch circuit via the second switch element, while transferring sixth data from the data bus to the third latch circuit via the third switch element, and
- turn on a set including the seventh switch element and the eleventh switch element, when the control circuit transfers the fifth data from the data bus to the first latch circuit via the third switch element, while transferring the sixth data from the data bus to the third latch circuit via the second switch element.

16. The device of claim 15, wherein the fifth data and the sixth data are serially transferred in the data.

17. The device of claim 7, wherein the control circuit is configured to:
- switch from the first operation to the second operation when a first condition is satisfied, and
- switch from the first operation to the third operation when a second condition is satisfied.

18. The device of claim 17, wherein:
- the first condition includes the first string or the first latch circuit being defective, and
- the second condition includes the second string or the second latch circuit being defective.

* * * * *